United States Patent [19]

Morrison, Jr.

[11] 4,434,038
[45] Feb. 28, 1984

[54] SPUTTERING METHOD AND APPARATUS UTILIZING IMPROVED ION SOURCE

[75] Inventor: Charles F. Morrison, Jr., Boulder, Colo.

[73] Assignee: Vac-Tec Systems, Inc., Boulder, Colo.

[21] Appl. No.: 187,140

[22] Filed: Sep. 15, 1980

[51] Int. Cl.³ .............................................. C23C 15/00
[52] U.S. Cl. ................................. 204/192 R; 204/298
[58] Field of Search ............................ 204/298, 192 R

[56] References Cited

U.S. PATENT DOCUMENTS

| | | | |
|---|---|---|---|
| 4,162,954 | 7/1979 | Morrison | 204/192 R |
| 4,180,450 | 12/1979 | Morrison | 204/192 R |
| 4,239,611 | 12/1980 | Morrison | 204/192 R |
| 4,265,729 | 5/1981 | Morrison | 204/192 R |

*Primary Examiner*—Arthur P. Demers
*Attorney, Agent, or Firm*—Gerald J. Ferguson, Jr.; Joseph J. Baker

[57] ABSTRACT

Method and apparatus for sputtering an element with a magnetron plasma source where a plasma is formed between two generator cathode surfaces of the source and a generator anode disposed adjacent the plasma ejects it toward the element to be sputtered. Various applications are described including selective coating of substrates of different electrical conductivity, substrate cleaning, ion milling, retrieval of expensive or dangerous coating materials, heating with little loss in the heat source, sputtering with reactive ions, sensitization or charge neutralization, and pumping of active gases.

167 Claims, 60 Drawing Figures

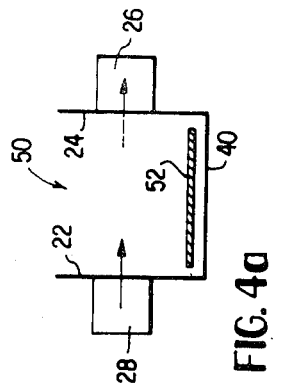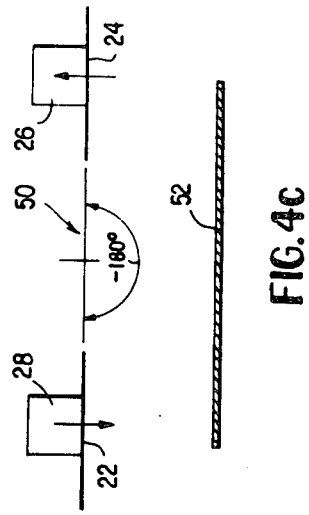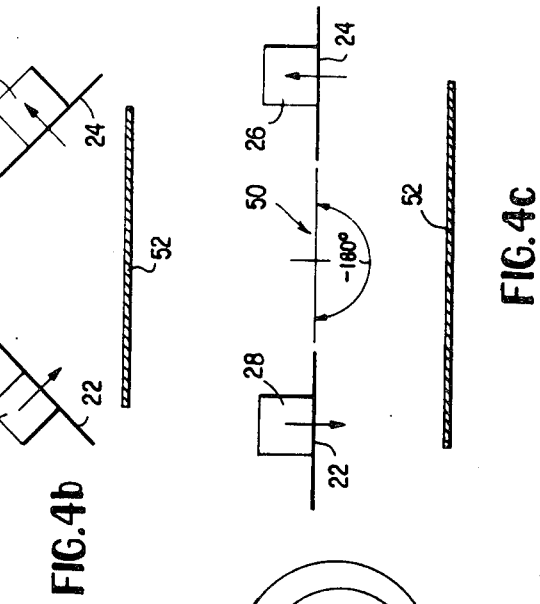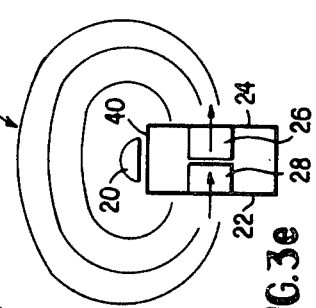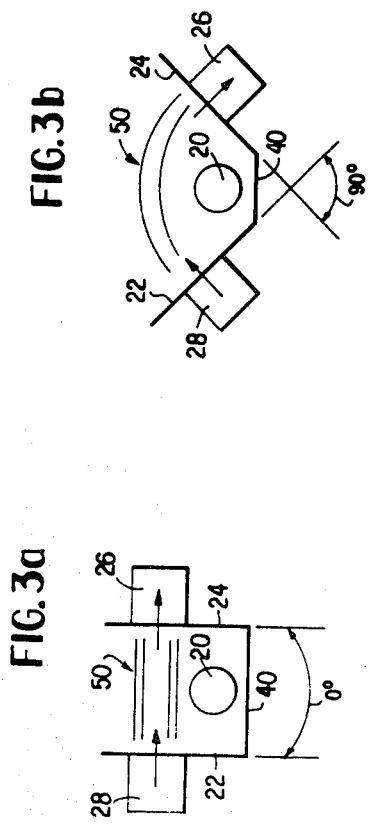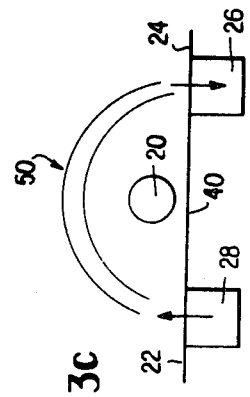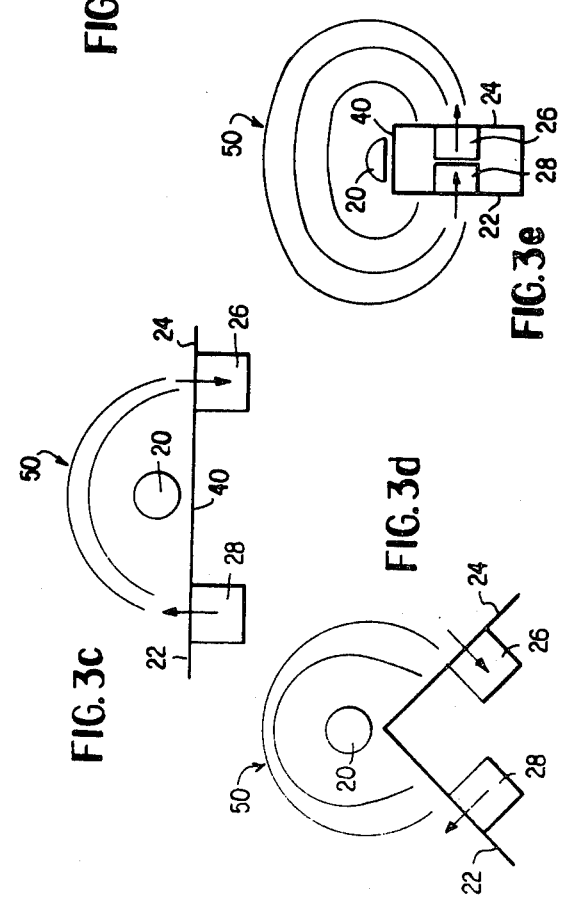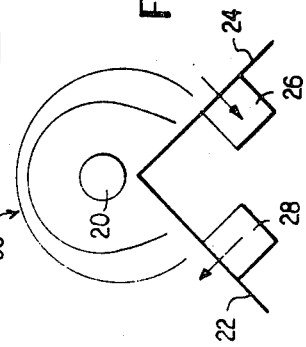

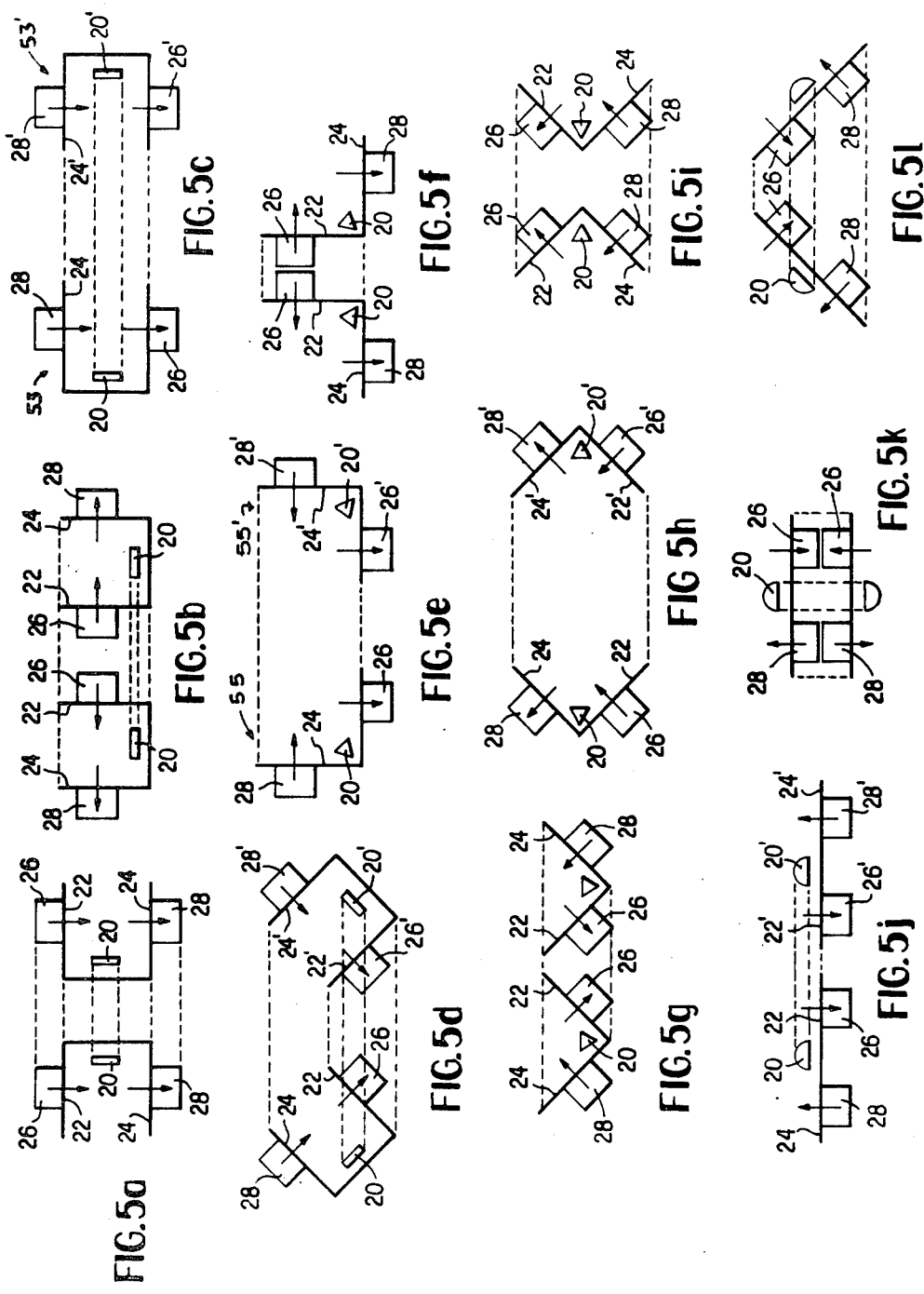

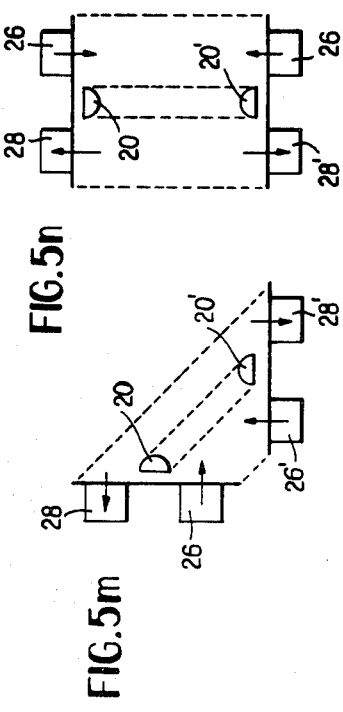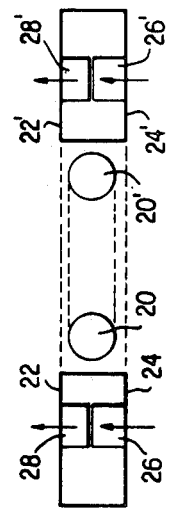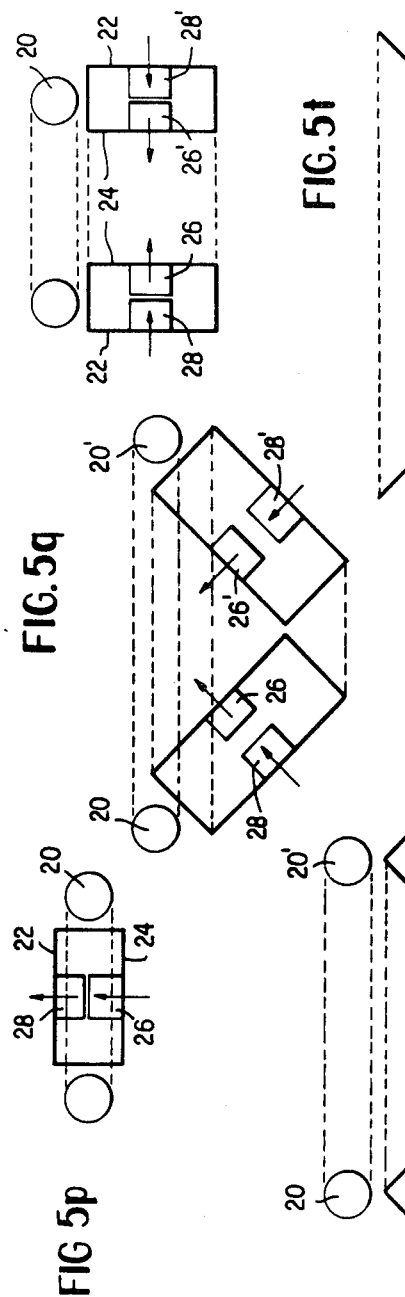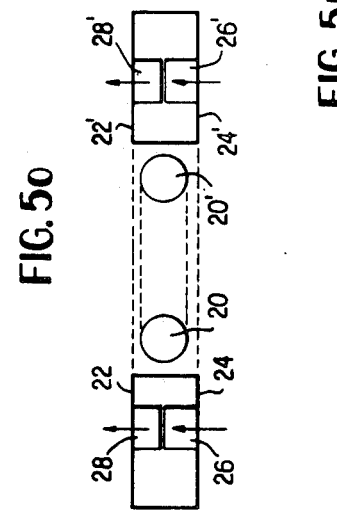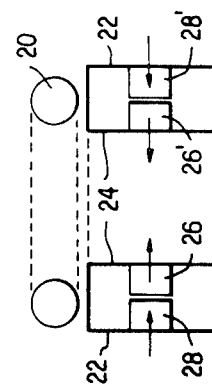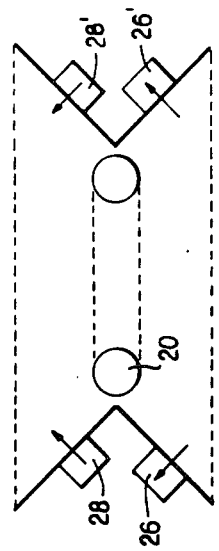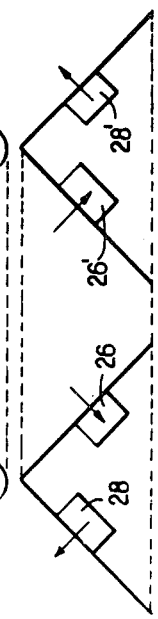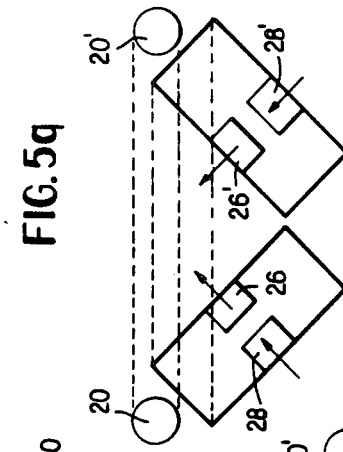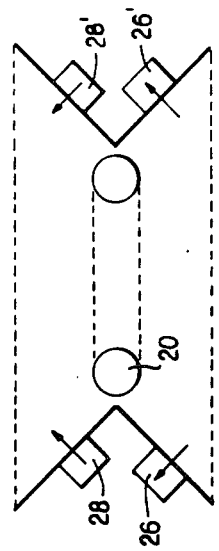

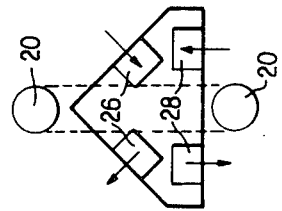
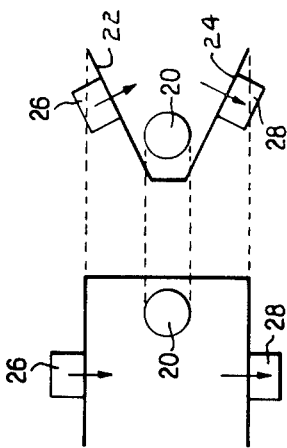
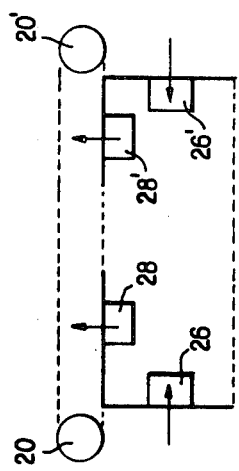
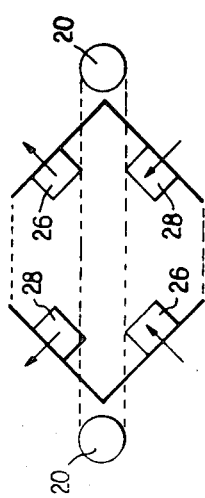
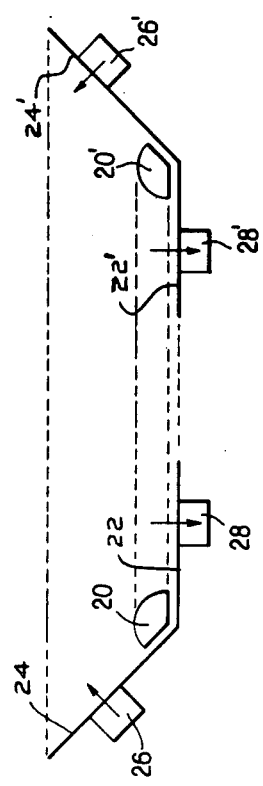

FIG. 19
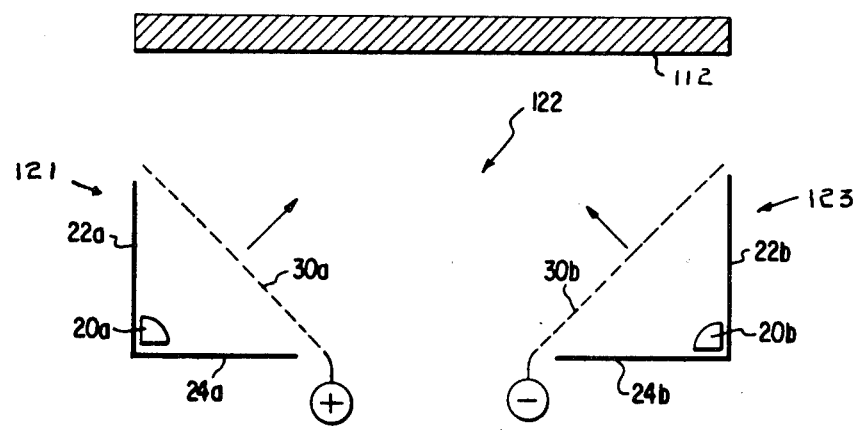
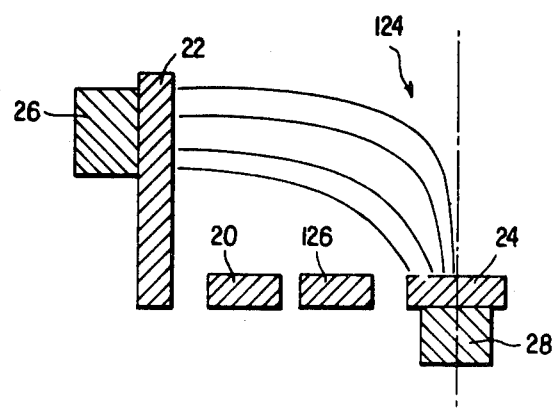
FIG. 20

SPUTTERING METHOD AND APPARATUS UTILIZING IMPROVED ION SOURCE

BACKGROUND OF THE INVENTION

This invention relates to sputtering methods and apparatus where a separate plasma source or the like may be employed and to various methods utilizing plasma sources.

In certain known sputtering systems were separate ion sources are utilized, the ion sources posess serious current denity limitations and are not most effectively applicable over a range of gas pressures generally employed in the most desired sequencer of vacuum processing, cleaning and coating operations. These problems and others associated with the prior art are avoided in the present invention in accordance with the following objects thereof.

OBJECTS OF THE INVENTION

It is an object of this invention to provide an improved sputtering method and apparatus utilizing an improved magnetron plasma source.

It is a further object of this invention to provide an improved magnetron plasma source.

It is a further object of the present invention to provide improved methods, all of which may utilize the foregoing magnetron plasma source such as selective coating of substrates of different electrical conductivity, substrate cleaning, retrieval of expensive or dangerous coating materials, heating with little loss in the heat source, sputtering with reactive ions, sensitization or charge neutralization, and pumping of active gases.

Other objects and advantages of this invention will be apparent from a reading of the following specification and claims taken with the drawing.

BRIEF DESCRIPTION OF THE DRAWING

FIGS. 3(a)-3(e) and 4(a)-4(c) are diagrammatic illustrations of plasma sources illustrating different opening angles thereof.

FIGS. 5(a)-5(w) and 6(a) and 6(b) are diagrammatic illustrations of plasma sources indicating various embodiments for establishing a closed plasma loop therein.

FIG. 19 is a diagrammatic illustration of an illustrative embodiment for sputtering a non-conductive target utilizing only D.C. power supplies.

FIG. 20 is a cross-sectional view of an illustrative combined plasma/sputter source.

DETAILED DESCRIPTION OF PREFERRED EMBODIMENTS OF THE INVENTION

Figure 1:
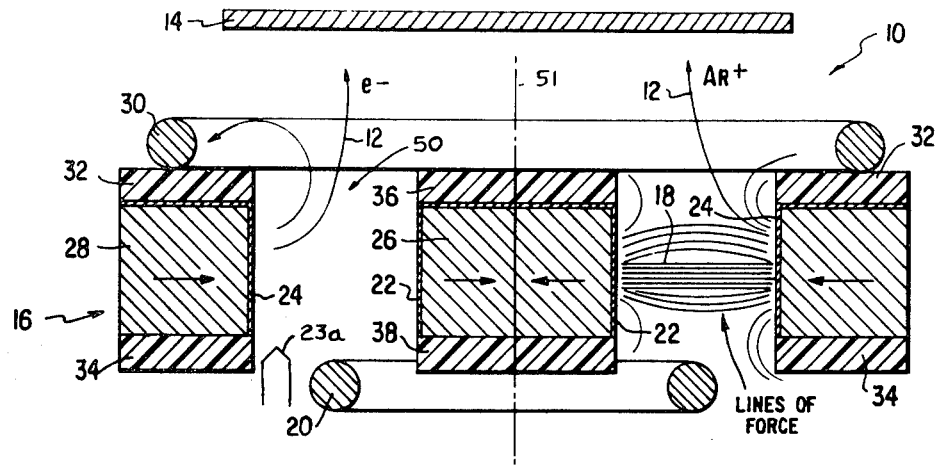
FIG. 1 is a cross-sectional view of an illustrative ion source in accordance with the invention.

Reference should be made to the drawing where like reference numerals refer to like parts.

Referring to FIG. 1, there is illustrated in cross-section a sputter ion source 10 in accordance with the invention which ejects positively charged ions (+ ions hereinafter) indicated at 12. The cross-sectional view in this embodiment, as in the other embodiments of the invention, may be of either a circular source or of an oval or rectangular source. The ions 12 may be directed at an element 14 which may be a substrate(s) which is to be cleaned or a target(s) which is to be sputtered or etched. These and other applications will be discussed in more detail hereinafter.

Ion source 10 includes a magnetron-type plasma source 16 which produces a plasma indicated at 18 where the plasma may be that of an inert gas such as argon, an active gas such as oxygen or nitrogen or a mixture of gases and where the pressure is very low as is typical in such applications. In magnetron-type devices crossed electric and magnetic fields are provided which enhance the ionization of a low pressure gas such as argon as is well known in connection with magnetron sputtering devices. The electric field is established between a generator anode 20 (which may be tubular to permit the circulation of a coolant therethrough) and a generator cathode 23 comprising cylindrical surfaces 22 and 24. The magnetic field is established by inner and outer magnet rings 26 and 28 which may either be permanent magnets or electro-magnets, as will be further discussed below. The direction of the lines of flux within magnets 26 and 28 may be as indicated by the arrows, arrows also being used for this purpose in the other figures of the drawing.

Due to the disposition of anode 20 to one side of plasma 18, the plasma is ejected from the open end 50 of source 16. A collector electrode 30 is disposed adjacent this open end of the source, it being positively biased to extract electrons from the plasma so that a + ion enriched stream of charged particles is ejected from source 10. Conversely, negative biasing of collector electrode 30 strips + ions from the ejected plasma to thereby convert source 10 to an electron source. Non-connection or removal of electrode 30 leaves the ejected plasma unaffected. Electrical isolation of cathodes 22 and 24 from electrode 30 and other biased surfaces is effected by insulators 32-38.

There will be little, if any, sputtering of generator cathode surfaces 22 and 24 since the lines of magnetic force are substantially perpendicular to these surfaces. Generally, at least a majority of the lines of force should be at angles of 45° or more if sputtering of these surfaces is not desired. Sputtering can also be lessened by employing carbon or carbon-compound materials or the like. Oxide coatings may also be provided to enhance electron emission from the cathode surfaces to enhance plasma formation.

Figures 2A, 2B, 2C:
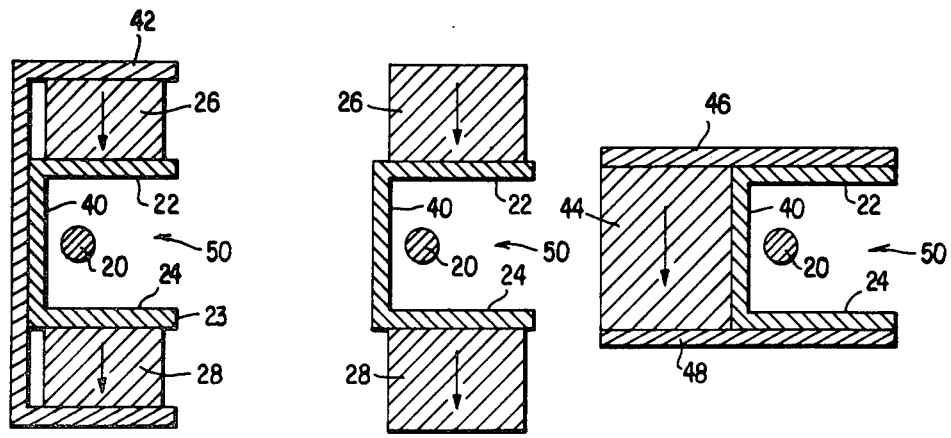
FIGS. 2(a)-2(c) are cross-sectional views of illustrative plasma sources in accordance with the invention.

In the embodiments of FIGS. 2(a)-2(c), generator cathode 23 comprises cathode surfaces 22 and 24 which are connected by a plate 40. Generator anode 20 is disposed in the center of the cathode so that it substantially shields those areas of plate 40 where the lines of magnetic force are other than perpendicular. Hence, sputtering of the plate is also substantially avoided. Accordingly, plasma is ejected from the open end 50 of the cathode, as in the FIG. 1 embodiment due to the disposition of the anode to one side of the plasma. A collector electrode (not shown) may strip either electrons or + ions from the plasma as discussed above with respect to collector electrode 30.

In FIG. 2(a), a magnetically permeable frame 42 is employed which may be helpful in preventing the formation of closed magnetic loops over surfaces 22 and 24 which would thereby tend to sputter these surfaces. As indicated in FIGS. 2(b), frame 42 is optional. In FIG. 2(c), a single magnet 44 together with magnetically permeable frame pole pieces 46 and 48 provide the requisite field which is substantially perpendicular to the cathode surfaces 22 and 24.

In the embodiments of FIGS. 1 and 2, cathode surfaces 22 and 24 face one another. This is diagrammically indicated in FIG. 3(a). In particular, the angle between cathode surfaces 22 and 24 is indicated as 0°. As illustrated in FIGS. 3(a)-3(e), the angle between the cathode surfaces may vary between 0° and 360°. FIGS. 3(b)-3(e) respectively illustrate angles of 90°, 180°, 270° and 360° between the cathode surfaces, it being understood any other angle may also be employed. In the configurations of FIG. 3, the open end 50 of the plasma source widens so that in the embodiments of FIGS. 3(b)-3(e), the plasma is immediately ejected over a wide angular range.

As illustrated in FIGS. 4(a)-4(c), the angle between the cathode surfaces 22 and 24 may also be varied through negative angles from 0° through −360°, the configurations of −90° and −180° being illustrated in FIGS. 4(b) and 4(c). Also note generator anode 52 which comprises a plate as opposed to the generator anode 20 of the FIGS. 3 embodiments. In some instances, generator anode 52 is more effective in preventing sputtering of plate 40 since it more completely covers the surface of this plate as indicated in FIG. 4(a).

In the embodiment of FIG. 1, a closed loop plasma path is indicated in that the plasma circulates around the ring-shaped (or oval-shaped) plasma source 16 in a plane substantially parallel to the plane of generator anode 20 where plasma to the left of the plane of symmetry indicated by imaginary line 51 moves into (or out of) the plane of the drawing between cathode surfaces 22 and 24 while on the other side of the loop to the right of plane 51, plasma moves out of (or into) the plane of the drawing once again between the cathode surfaces 22 and 24. In the configurations of FIGS. 2, 3 and 4, there are illustrated cross-sections of the plasma source which may correspond to the left (or right) half of the FIG. 1 configuration. That is, provision may be made to complete the plasma loops of the FIGS. 2-4 configurations as is indicated in FIG. 1. By completing the plasma loop configurations, the loss of ionizing electrons produced by generator cathode 23 is minimized and thus, the efficiency of the source is enhanced. However, in appropriate situations, a strip source, the cross-section of which is, for example, illustrated by the configurations of FIGS. 2-4, wherein the plasma loop is not closed, may be utilized.

In FIGS. 5(a)-5(v), there are illustrated various configurations which illustrate how a closed plasma loop may be effected. Thus, in the embodiments of FIGS. 5(a)-5(d), the cathode surfaces are at 0° with respect to one another and correspond to the FIG. 3(a) embodiment. In FIG. 5(a), the opposite legs of the source are directed away from one another while in FIG. 5(b), they are upwardly directed and in FIG. 5(c) they are directed to one another and in FIG. 5(d) they are inclined toward one another.

It should be noted with respect to FIGS. 5(c) and 5(d) that the circular ends of oval-shaped plasma sources may be removed. That is, two separate strip sources may be employed. Thus, referring to FIG. 5(c), one of the strip sources 53 has the elements thereof indicated by unprimed reference numerals while the elements of the other strip source 53' are indicated by primed reference numerals. It appears the plasma from source 53 is partially fed to source 53' and vice versa. This cross-feeding of the plasma appears to result in a plasma loop which is formed in the plane of the drawing. Accordingly, the efficiency of the FIG. 5(c) configuration remains substantially the same whether or not the ends of the strip sources 53 and 53' are joined to provide an oval-shaped source. In general, it is only necessary that part of the plasma from one strip source (or channel) flow to the other strip source (or channel).

With respect to plasma source 53, anode 20' of source 53' acts as an electron collector as does anode 20 for source 53'. Hence, the plasma ejected from sources 53 and 53' is + ion rich. The foregoing remarks apply whenever strip sources face one another. Typical configurations where separate strip sources may face one another are also indicated in the remaining embodiments of FIG. 5 by employing unprimed reference numerals for one side of the source and primed reference numerals for the other side of the source. If separate strip sources are employed, the dotted lines connecting the opposite sides of the source as shown in the foregoing embodiments would not appear.

Referring to FIGS. 5(e)-5(i), there are shown different plasma sources which illustrate how the plasma loop may be closed with the 90° source of FIG. 3(b). FIG. 5(e) illustrates a preferred embodiment for generating a + ion rich plasma. It should be noted that as ions are ejected from source 55 of FIG. 5(e), some of these ions will be directed toward the cathode surfaces 22' and 24' of source 55' to sputter the latter surfaces. As will be described hereinafter, sputtering of these surfaces in some instances may be desirable. However, if sputtering is to be avoided, the configuration of FIG. 5(g) would be more preferable.

Referring to the embodiments of FIGS. 5(j)-5(n), there are illustrated various embodiments for closing the plasma loop of FIG. 3(c), while FIGS. 5(o)-5(r) illustrate various embodiments for closing the plasma loop of the FIG. 3(e) source and FIGS. 5(s)-5(v) illustrate various embodiments for closing the plasma loop of the FIG. 3(d) embodiment. FIG. 5(w) illustrates an embodiment for closing the plasma loop of a plasma source whose cathode surfaces 22 and 24 are disposed at an angle of 135° with respect to one another.

Hybrid configurations are also possible as indicated in FIGS. 6(a) and 6(b). Thus, FIG. 6(a) is a hybrid configuration where one leg of the closed loop corresponds to FIG. 3(d) and the other to FIG. 3(b) while in FIG. 6(b) one leg corresponsponds to FIG. 3(a) and the other to a leg where the cathode surfaces 22 and 24 are disposed at an angle of approximately 60° with respect to one another.

Figure 7A:
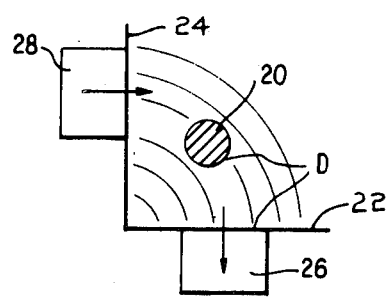
FIG. 7(a)-7(d) are diagrammatic illustrations showing factors relative to heating of the generator anode of a plasma source.
Figure 7B:
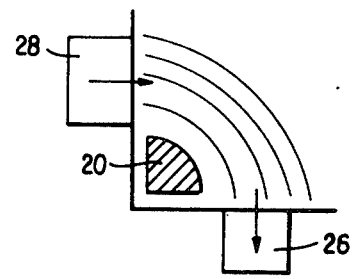
Figure 7C:
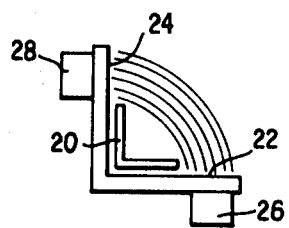
Figure 7D:
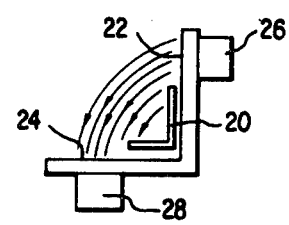

In those embodiments of the invention where little, if any, sputtering of the generator cathode 23 occurs, there is very little heating of the cathode. Heating of the generator anode can also be minimized. Anode heating typically results from it being struck by energetic electrons. In a crossed field device this may imply the magnetic field is not adequately trapping the electrons. If the magnetic field is sufficiently strong, the problem can usually be traced to lines of force which start at the cathode and end at the anode as indicated at D in FIG. 7(a). Thus, where the emitted electron is free to move along a line of force, limited only by electrostatics, it is readily accelerated from cathode to anode. This almost immediate electron loss prevents those electrons from being effective plasma generators, and dumps their energy into the anode. As indicated in FIGS. 7(b) and 7(c), this problem may be lessened by shaping and/or locating the anode such that it does not intercept lines of force from the cathode except at very short distances. In these figures, the lines of force which strike the anode travel preferably no more than approximately 1/16" from the cathode and generally no more than ⅛" from the cathode. In FIG. 7(d), there is also heating caused by electrons that can move along the arrowed path 22' from cathode to anode following lines of force. An appropriately designed source employing the foregoing considerations has been tested and it has been demonstrated that an entire stainless steel vacuum chamber can be substantially heated without the source 16 becoming hot. The energy transfer efficiency thus indicated appears to be quite high. As will be further discussed with respect to FIG. 23, it appears items can be heated using the plasma source of the present invention with little loss of heat in the source.

Figure 8:
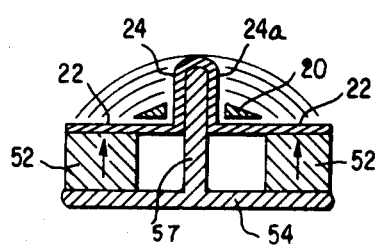
FIG. 8 is a cross-sectional view of a plasma source in accordance with the invention.

Referring to FIG. 8, there is shown an embodiment of the invention which incorporates the features of the embodiments of FIGS. 7(b) and 7(c) and which approximates the FIG. 5(f) configuration. In particular, ring or oval-shaped magnet 52 has the lower portion thereof coupled by a T-shaped magnetically permeable (steel, for example) coupler, the vertical leg 57 of which projects between cathode surfaces 24 and 24a. The magnetic lines of force are as indicated. Hence, FIG. 8 demonstrates that there are many further variations of the FIGS. 3-5 embodiments.

Figure 9:
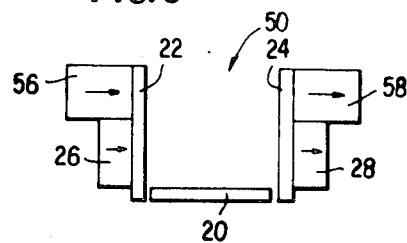
FIG. 9 is a diagrammatic illustration indicating the generation of different strength magnetic fields in a plasma source.

FIG. 9 also demonstrates variations which can be made with respect to the magnetics. Thus, in addition to magnets 26 and 28, magnets 56 and 58 may also be employed where the strength of the field produced by magnets 56 or 58 may be greater than or less than that produced by magnets 26 or 28 depending upon the application.

Figure 10:
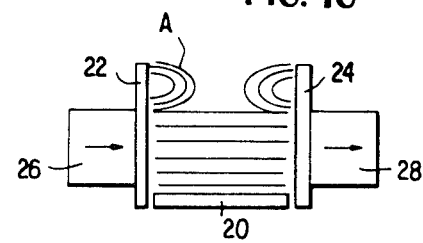
FIG. 10 is a diagrammatic illustration indicating the formation of undesired closed magnetic field loops in a plasma source.
Figure 11:
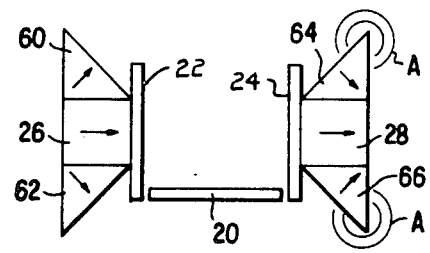
FIG. 11 is a diagrammatic illustration of an illustrative plasma source for avoiding the problem illustrated by FIG. 10.

As indicated hereinbefore with respect to FIG. 2(a), the relationship of the magnets 26 and 28 of FIG. 10 and the cathode surfaces 22 and 24 may be such that closed magnetic loops as indicated at A may form, under which sputtering of cathode surfaces 22 and 24 can occur. The embodiment of FIG. 2(a) will tend to correct this as will that of FIG. 11 where the outer portions of the magnets 26 and 28 are shaped as indicated at 60-66 to produce the closed fields A away from over the cathode surfaces 22 and 24.

As indicated hereinbefore, the magnetic field of the ion source may be generated by permanent magnets or electro-magnets. FIGS. 12(a)-12(d) indicate different configurations wherein electro-magnets are employed. Thus, in FIG. 12(a), which generally corresponds to FIG. 2(c), the magnetically permeable pole plates 46 and 48 are disposed at opposite ends of electro-magnet 68 which is wound on magnetically permeable spindle 70.

Figure 12A:
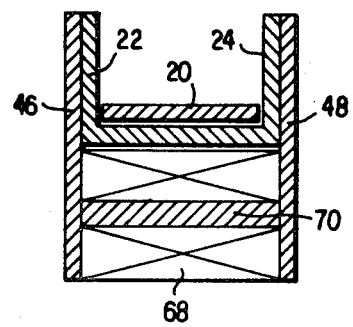
FIGS. 12(a)-12(d) are cross-sectional views illustrating the use of electro-magnets in the plasma source.
Figure 12B:
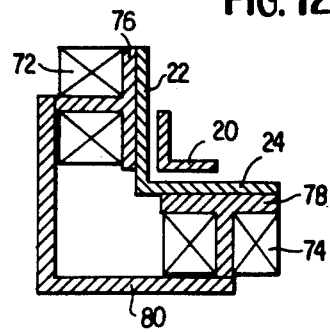
Figure 12C:
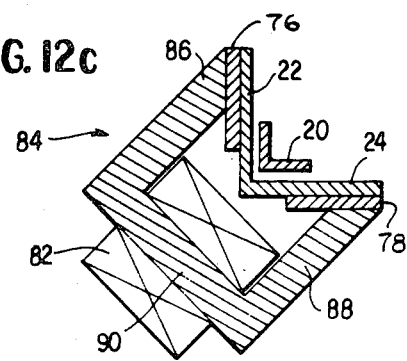
Figure 12D:
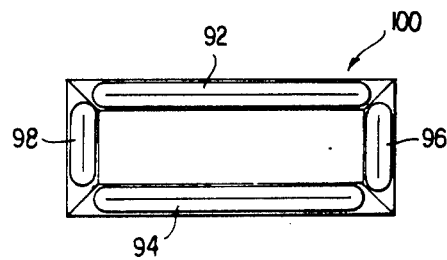

The embodiments of FIGS. 12(b) and 12(c) generally correspond to FIG. 3(b) where in FIG. 12(b) electro-magnets 72 and 74 in contact with pole plates 76 and 78 to establish the ion source magnetic field and where the electro-magnets are coupled to each other via magnetically permeable, L-shaped coupling plate 80. In FIG. 12(c), electro-magnet 82 is coupled to plates 76 and 78 via U-shaped pole piece 84 which includes legs 86-90. Typically, the individual sides 92-98 of a picture-frame ion source 100 would be wound separately as indicated in FIG. 12(d). Many other embodiments employing electro-magnets can also accomplish the function of generating a magnetic field which loops across generator anode 20 and which enters and exits perpendicular to generator cathode surfaces 22 and 24 for each angle of opening between the cathode surfaces.

As indicated hereinbefore, sputtering or cleaning of element 14 of FIG. 1 are certain applications for which ion source 10 can be employed. These applications together with other applications of the ion, electron and plasma sources described hereinbefore will now be discussed in further detail.

As stated before, element 14 may either be a substrate(s) which is to be cleaned or a target(s) which is to be sputtered. It should be appreciated that the effect of releasing positive ions against a substrate is to sputter the substrate as if it were a target. Thus, the removal of a few monolayers of the substrate is an effective cleaning method. Of course, the ion source need not only be a cleaning tool. Thus, where the cleaning is sputtering, this is very little difference from using the source in conjunction with a sputter target. The principle differences are in orientation and electrical bias voltages as indicated in FIGS. 13-18. As can be seen from these figures, a non-sputtering, picture-frame, ion source is provided which can be used either as an ion source for cleaning substrates or as an ion source for effective sputtering of a target. Thus, in FIG. 13, there is illustrated apparatus for sputtering a target 102 via an ion source which corresponds to FIG. 5(b), the target 102 and the generator cathode 23 being negatively biased by D.C. power supply 104 with respect to generator anode 20 and electron collector electrode 30. Thus, + ions bombard the target to effect sputtering thereof. The generator anode may be at ground potential as indicated at 106 although in many applications it is preferred that it be above ground potential. The negative bias on the generator cathode 23 may be adjusted by variable resistor 108.

Figure 13A:
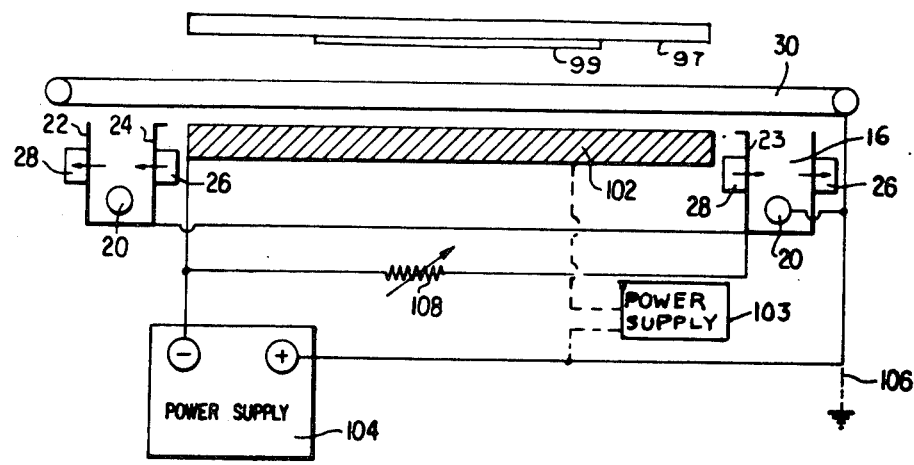
FIGS. 13-15 are diagrammatic illustrations of illustrative embodiments utilizing a plasma source for target sputtering.
Figure 14:
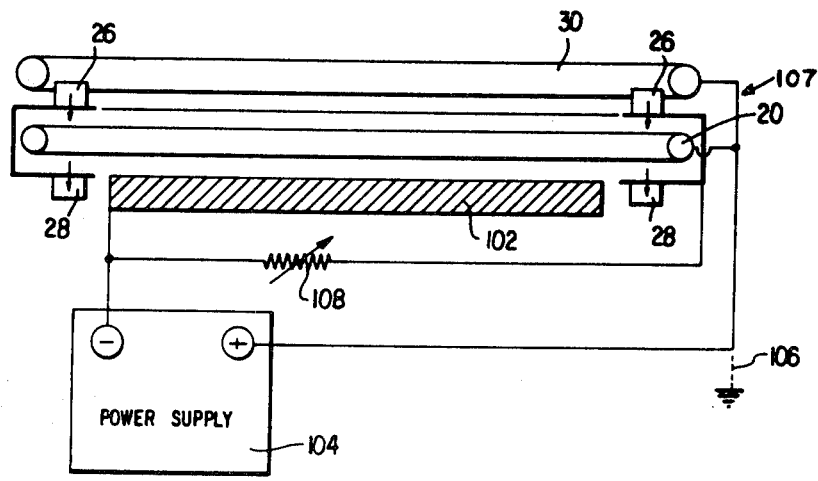
Figure 13B:
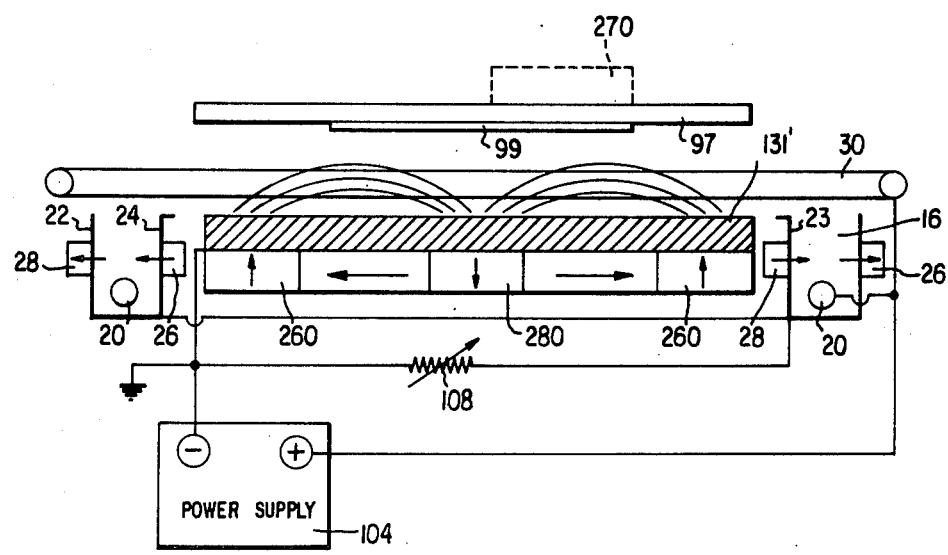
Figure 15:
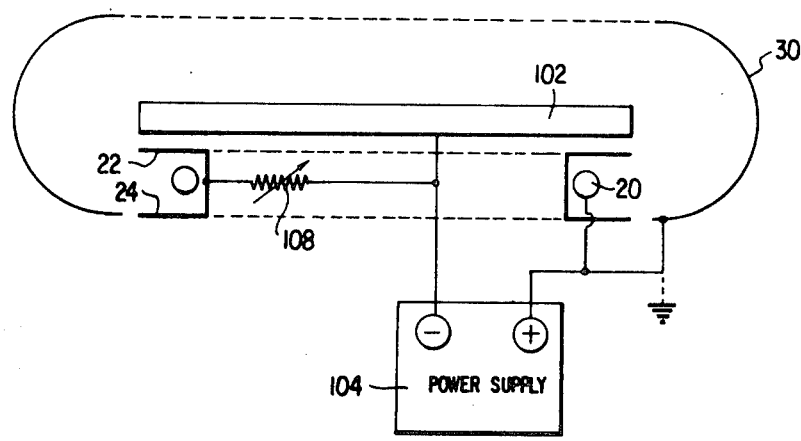

FIGS. 14 and 15 are similar to FIG. 13 except that the ion source of FIG. 14 corresponds to the embodiment of FIG. 5(c) while that of FIG. 15 corresponds to FIG. 5(a). Although there is some difference in the immediate directivity of the different ion sources of FIGS. 13-15, all of these sources will provide substantially the same constant uniformity of sputtering of the target 102. Further, even if the target is made of a magnetically permeable material, these sources can sputter the target since no magnet field projects through the target.

Figure 16:
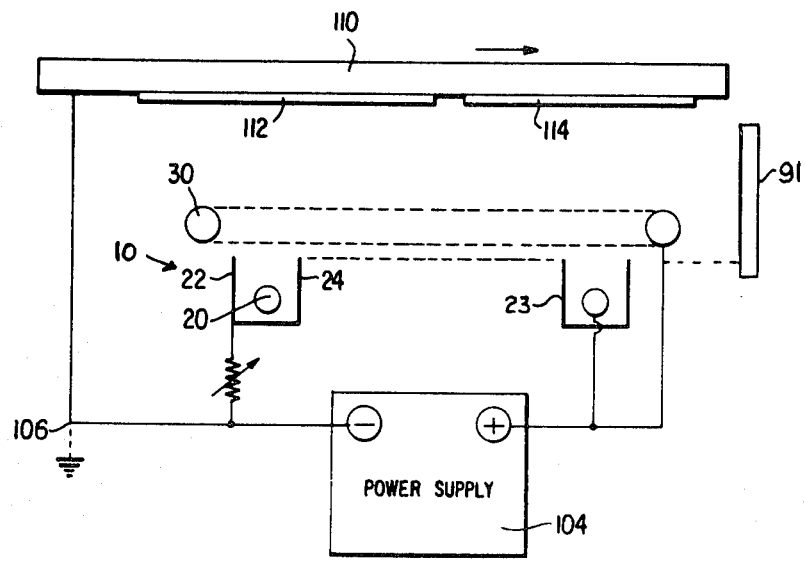
FIGS. 16 and 17 are diagrammatic illustrations of illustrative embodiments utilizing a plasma source for substrate cleaning.
Figure 17:
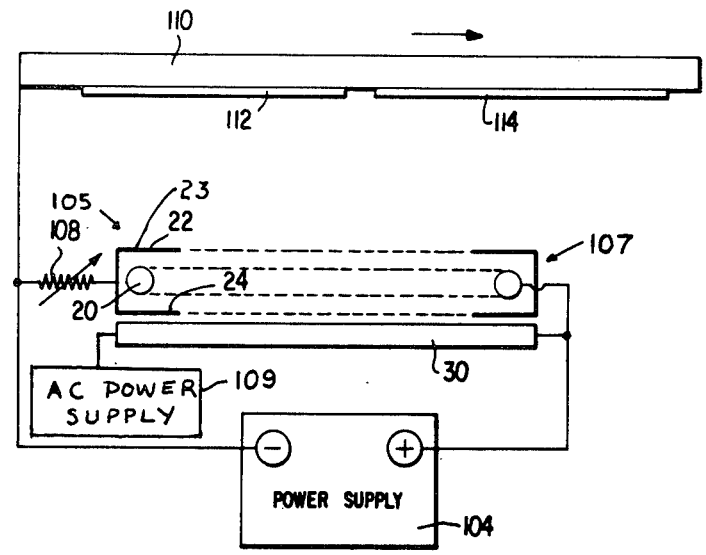

Referring to FIGS. 16 and 17, there are illustrated embodiments where the ion source is employed to clean substrates 112 and 114, the difference being the orientation of the sources. Typically, the substrates would be mounted on a holder 110 which may carry the substrates in the direction of the arrow. The generator electrode 23 and substrate holder 110 are negatively biased with respect to generator anode 20 and electron collector electrode 30 by D.C. power supply 104 where substrate holder 110 and the substrates 114 are conductive. However, as will be discussed in more detail hereinafter, the embodiments of FIGS. 16 and 17 with certain modifications may also be employed to clean non-conductive substrates. The foregoing also applies to the sputtering of non-conductive targets with the embodiments of FIGS. 13-15.

Figure 18:
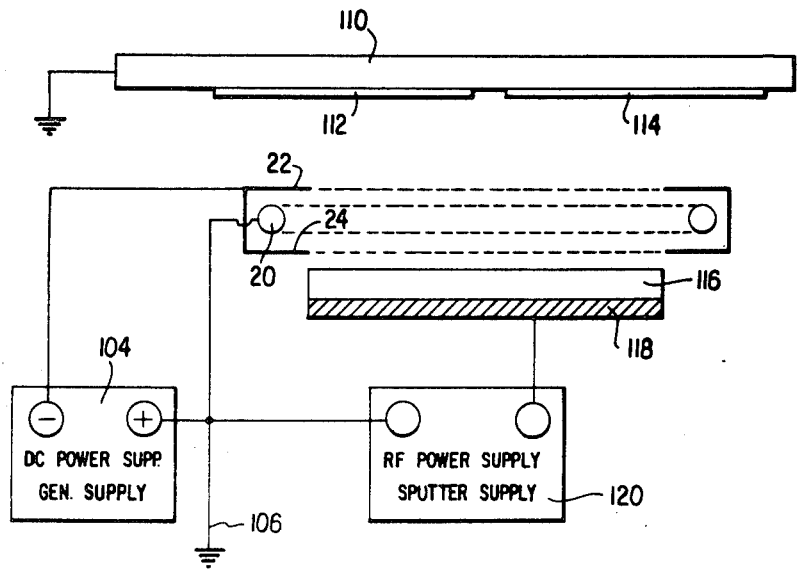
FIG. 18 is a diagrammatic illustration of an illustrative embodiment for sputtering of an electrically non-conductive target.

One embodiment for sputtering an electrically, non-conductive substrate is illustrated in FIG. 18 where an RF power supply 120 drives a non-conductive substrate 116, the substrate being disposed on a conductive target holder 118. D.C. power supply 104 negatively biases generator cathode 23 with respect to grounded generator anode 20. The sputtered non-conductive material is deposited on substrates 112 and 114.

In general, the use of RF power supply 120 is disadvantageous and can be avoided as will be discussed below. However, it should first be generally remembered source 16 is fundamentally a plasma source. Thus, it is equally effective at providing electrons and + ions. It can be made an ion source by removing electrons from the plasma. In similar fashion, ions can be removed to project electrons. This is primarily a matter of driving the auxiliary collector electrode 30 with negative rather than positive D.C. power. This will then strip ions from the exiting plasma giving a net flow of electrons to the target or substrate.

If the target or substrate is a non-conductor, it would not be possible to effectively bombard it with positive ions only, for it would quickly charge to a sufficient voltage that no further ions could strike with force. However, if when charge saturation is approached, the polarity is reversed and electrons are projected, the positive charge is discharged and a negative charge is established. Polarity may then be again reversed, etc. In other words, an A.C. signal applied to auxiliary collector electrode 30 via A.C. power supply 109 (FIG. 17) in lieu of power supply 104 provides for effective bombardment of insulating substrates (or targets). Supply 104 would still be used to bias the generator anode 20. This embodiment is a significant improvement over the FIG. 18 embodiment in that applying A.C. or RF power to a moving substrate is difficult. Such A.C. or RF drive of fixed electrode 30 is much more effective.

In general, RF is less efficient and more difficult to apply than D.C. In addition, it typically requires sufficiently different argon pressure from that desired in other parts of most multi-step vacuum coating processes that it must be conducted behind closed locks. This adds significantly to the complexity and cost of the systems. Most effective cleaning requires metal electrode backing for the insulator parts, making it difficult to clean complex shapes. As will be discussed below, the embodiment of FIG. 19 avoids the foregoing problems in that it provides sputter cleaning and sputtering coating of non-conductor materials using only D.C. sources.

The reason RF source 109 of FIG. 17 provides Ar+ impingement on non-conductive substrates 112 and 114 is the negative half cycle destruction of the + charge on the non-conductor surface. In the embodiment of FIG. 19, compound source 122 comprises electron source 121 and Ar+ source 123 whereby the destruction of + charge occurs simultaneously rather than sequentially as in FIG. 17. That is, the Ar+ ions are simultaneously directed with electrons to the non-conductor surface so that that surface cannot charge to a + value and reject the Ar+.

To the degree that the Ar+ and electron beams overlap on the surface, sputtering of that surface is effected. Since both sources 121 and 123 are D.C., as are the auxiliary electrodes, cleaning and sputtering of non-conductor surface 122 is achieved without recourse to radio frequency power. In addition, no magnetics are associated with the substrate or the target—only with the ion source 122.

Assuming target 102 of the FIGS. 13 and 15 embodiments is electrically non-conductive and that the substrates 112 and 114 of the FIG. 16 embodiment are also non-conductive, these targets or substrates may be simultaneously bombarded with + ions and electrons by disconnecting the collector anode 30 from the power supply. In these embodiments, collector electrode 30 removes electrons from the ejected plasma due to the positive biasing of this electrode with respect to the generator cathode 23. By removing this positive bias on collector electrode 30, the ejected plasma remains electrically neutral with a substantially equal population of + ions and electrons. Thus, simultaneous destruction of positive charge build-up on non-conductive target 102 or non-conductive substrates 112 and 114 may be effected due to the simultaneous bombardment of these elements with the + ions and electrons of the ejected plasma. The ejected output from the sources of the FIGS. 14 and 17 embodiments will tend to be + ion rich even if the collector electrode 30 is disconnected from the power supply inasmuch as the ion source is inwardly directed in these embodiments. Especially if sources 105 and 107 are separate strip sources as discussed hereinbefore with respect to FIG. 5(c), the ejected output will be + ion rich. Accordingly, these embodiments tend not to be as suitable for ejecting a neutral plasma as are the embodiments of FIGS. 13, 15 and 16. However, sufficient negative bias on collector electrode 30 can bring about a neutral to negatively charged plasma output.

A number of the possible uses of the improved ion source of the present invention, including those discussed hereinbefore, will now be summarized and described.

1. Sputter Cleaning a. + Ion Bombardment

This application may employ an external collector electrode as in the embodiment of FIG. 16 to remove electrons from the ejected plasma so that a net supply of + ions is provided. In the embodiment of FIG. 17, the collector electrode may be disconnected from the power supply due to the fact that the ion sources face one another especially if they are two separate strip sources and yet a net supply of + ions is provided.

Since the net supply of + ions is provided in the foregoing embodiments, the substrates 112 and 114 of FIG. 17 should be conductive and grounded or biased negatively to prevent positive charge build-up.

b. Plasma Bombardment

As indicated above, no collector electrode 30 is required to operate in this mode. Substrates 112 and 114 of FIG. 17 draw no net current and thus, they need not be electrically connected to anything. Thus, the substrates 112 and 114 may be electrically non-conductive or electrically conductive and electrically isolated from the power supply or electrically conductive and connected to the power supply.

2. Sputter Deposition a. + Ion Bombardment

The same considerations apply here with respect to FIGS. 13–15 as those mentioned above with respect to sputter cleaning by + ion bombardment. Generally, the source would be directed toward sputter cathode 102. However, this is not mandatory in that most, if not all, of the sources described hereinbefore are omni-directional although they tend to be omni-directional at points substantially removed from the source. In the embodiments of FIGS. 13–15, the same power supply 104 is used to bias both the generator cathode 23 and the target 102. However, a separate power supply 103 may be employed to provide an independent target bias. In this manner, the ion impact energy at the target can be controlled independently of the ion current ejected from the source. Similar considerations apply to the substrate cleaning embodiments of FIGS. 16 and 17 where a separate power supply may also be provided for substrates 112 and 114.

With respect to the sputtering of magnetically permeable targets, since there is no magnetic field at the target, high sputtering rates can be achieved while at the same time effecting high target utilization due to the uniform sputtering thereof.

In all magnetically enhanced cathodes such as planar magnetrons, there are strict limitations to the size and shape of the target. In the ion source sputtering system of the present invention, target cooling and protection of the cooling coils are the only real size concern. A very large ion source can easily sputter a tiny target. If the target is very large relative to the source, the rate will be low, but the total quantity of sputtering is the same as for a smaller target. Because the target is not related to the magnetic field, there are not the same restrictions present as with planar magnetrons or the like. Thus the permeability of the target is unimportant. It is possible to direct the ion source into a nearly closed enclosure of target material and deposit on an isolated or + biased substrate from all directions simultaneously.

b. Plasma Bombardment

This application also involves considerations similar to those involved with respect to the cleaning of substrates. Hence, sputtering of either metals or non-conductors can be effected. Further, the target need not be electrically biased since no net current flow is involved. However, a negative voltage applied to the cathode may be of assistance in the case of conductive targets for ion acceleration. Further, an RF bias applied to the target may be helpful for non-conductive targets. Again, the plasma will sputter independent of target magnetic permeability.

3. Sputter Deposition With Ion Impingement a. Ion Bombardment

Referring to FIG. 13, substrate 99 will be coated with the material sputtering from target 102 where + ion rich plasmas are preferred for a conductive target but where a neutral or electron rich plasma may be employed for either conductive or non-conductive targets. If a conductive target is used such as aluminum and if the + ions are generated from an inactive gas such as argon, the + argon ions may also bombard substrate 99 if it is appropriately biased. Thus, a combination of sputtered aluminum and + argon ions impinge on the surface of substrate 99. Assuming the substrate 99 is electrically conductive and appropriately biased, and assuming that the sputtered aluminum output rate is sufficiently greater than the + argon output impinging on the substrate, the substrate will be coated and ion bombarded. That is, as aluminum coats onto the substrate, the argon ions will bombard the coated substrate which provides increased reaction energy to back sputter or etch away any poorly bonded aluminum atoms of the coating. The resulting bond strength between the coating and substrate 99 is better than that attained by conventional sputtering or evaporation.

In conventional evaporation-ion plating, a coating material is evaporated toward a substrate and argon is simultaneously introduced close to the substrate. The substrate is then forced to negative potentials to establish a discharge about it. The argon ions created by the discharge then bombard the substrate to provide the desired back sputtering with the resulting ion plating. As can be seen in the present invention, the need for a separate bias voltage source is obviated although the substrate should have appropriate bias applied thereto. This bias will be between the voltage of the anode and cathode, so can be obtained easily from that power supply, or can be obtained by adjusting the plasma polarity as discussed below. Ion bombardment is used at the substrate, but no discharge, per se, is needed there, as it is in conventional ion plating.

b. Plasma Bombardment

Sputter-ion impingement of non-conductive substrates or electrically isolated conductive substrates can also be effected by bombarding the substrate (and target) with an electrically neutral or electron rich plasma. + argon ion build-up on the substrate (and target) will be neutralized by the electrons present in the plasma. Hence, sputter-ion impingement of electrically non-conductive substrates can be effected.

In order to effect sputter-ion impingement with either + ion or plasma bombardment, the sputtered aluminum output rate must be greater than the rate of plasma etching applied to substrate 99. If it is not, the + argon ions will etch away the aluminum as fast as it can be deposited on surface 99. In fact, there can be significant etching of the substrate during the procedure. This will be further discussed below.

4. Selective Sputter Deposition/Sputter Cleaning

Depending upon the electrical conductivity and electrical potential of the substrates 112 and 114 of FIGS. 13–15, they can be selectively sputtered or etched. For example, if generator cathode 23 is at ground potential and the output is both aluminum being sputtered from target 102 and Ar+ ion rich plasma from the ion source and if substrate 99 is conductive and grounded, it will etch. If it is non-conductive, it will coat with aluminum. The reason for this is that in an ion rich output, insulating surfaces will quickly charge to a + voltage that is equal to the energy of the + ions in the source output at that chamber location. Once it has been established, this positive potential prevents + ions from striking these surfaces, and thus the etching caused by + ion bombardment stops. However, because the source output includes neutral atoms of aluminum sputtered from the target, this metal plates on insulating surfaces and typically on all of the rest of the system interior. On the grounded metallic surfaces, however, no + charge can accumulate and ion bombardment continues full force, sputtering (etching) away the aluminum as fast as it can arrive. Thus, there is no accumulation of aluminum on these surfaces. In fact, they can be significantly etched during the reaction. In a test which was conducted in a copper coated chamber, aluminum was plated on plastic parts, windows, and other dielectrics and simultaneously the copper was cleaned from the walls of the chamber coating, and added to the dielectrics.

If the potential of the generator cathode is changed to below ground and the output to electron rich, then plastic surfaces charge negatively and selectively attract the + ions. In this mode, dielectric surfaces can be selectively etched rather than coated. For conductive substrates, their voltage can be adjusted such that they either coat or etch. Making them positive leads to coating, negative etches them. Dielectrics or electrically isolated metal substrates coat or etch depending primarily in the + ion/electron ratio in the source output where a + ion rich output leads to coating and an electron rich or neutral output leads to etching.

Using these techniques a metal in contact with dielectrics can be selectively coated, keeping the dielectrics clean. Thus, assuming substrate 99 of FIG. 13 is a metallic and assuming carrier 97 is dielectric, the source 16 may be made electron rich and substrate 99 runs at + voltage. There are problems associated with the opposite situation, namely coating a dielectric and etching the metal in contact with it. The dielectric quickly charges opposite in polarity to the metal and an arc like discharge is established between them. The conductive coating being placed on the insulator tends to concentrate the voltage gradient at the edge of the conductor, creating violent discharge there.

As stated above, all of the foregoing is subject to the relationship between sputtered metal output rate and plasma output of the source. If the system is in an etch mode but has a greater sputter output then etch capability, then the substrate is sputter-ion impinged.

For certain purposes, the embodiments of FIGS. 13-15 have been considered above as combined sputter deposition/sputter cleaning sources. In these embodiments, the sputter deposition source (that is, target 102) is separated from plasma source 16. This separation of the sources is avoided in the embodiment of FIG. 20. The combined source 114 includes a sputter target cathode 126 which is not covered by generator anode 20 and which does not have magnetic lines of force entering or exiting perpendicular therefrom. Thus, the output from source 124 will be a combined output of the neutral atoms sputtered from target 126 and plasma, the plasma being produced in the same manner as that produced by plasma generator 16. A collector electrode (not shown) may be used to selectively remove either electrons or + ions from the ejected plasma. Hence, the combined sputter/etch source of FIG. 20 may be employed in the same manner as those of FIGS. 13-15 for selective coating and etching or sputter-ion impingement, etc.

5. Reactive Sputter Deposition

In reactive deposition processes, an active gas or ions thereof contacts the sputtered material whereby a compound of the sputtered material and the active gas are formed on the substrate as is well known. Referring to FIG. 13 and assuming that the active gas is present between substrate 99 and target 102, + ion or plasma bombardment of the target will result in even target erosion. Thus, there are no areas where the reacted target tends to have a different behavior from the remainder of the target. Hence, high target utilization and sputter rates can be provided even in reactive applications.

Assuming the plasma generated by source 16 is that of an active gas and assuming electrons are removed therefrom by collector electrode 30, an active ion bombardment of the sputtered layers deposited on substrate 99 occurs thereby helping to guarantee the stoichiometry of the reaction. This process thus involves reactive sputter-ion impingement and corresponds to the sputter-ion impingement process described above, the only difference being that ions of a reactive gas are used rather than those of an inert gas. This application permits reactions that require considerable surface energy such as the formation of CrN.

When the output of source 16 impacts both substrate 99 and target 102, both of the above described advantages can be achieved—that is, reactive ions directed to the target provide uniform sputtering and high sputter rates thereof while the reactive ions directed to the substrate provide reactive sputter-ion impingement thereat. In fact, a novel feature of the present invention resides in the fact that reactive ions can be used to sputter targets and yet high sputter rates can be achieved.

Further, a combination of both active and inert ions may be directed at both the target and/or substrate. Such a combination of ions may be produced by feeding both active and inert gases into plasma source 16, although it is to be understood in all embodiments of this invention that the gas(es) to be ionized may be introduced elsewhere in the system such as adjacent target 102 since the gas may be used for other purposes. When ions (active and/or inert) are directed to both the target and substrate, the target voltage vs. substrate voltage will determine the relative energies.

6. Surface Reaction Without Simultaneous Sputter Deposition

The embodiments of FIGS. 16 and 17 may be utilized to provide a surface reaction at substrates 112 and 114 with an active gas which may be introduced adjacent the substrates. If, in FIG. 16, the collector electrode 30 is disconnected from the power supply to provide neutral output, or negatively biased to provide a negative inert gas plasma bombardment of the substrates, surface energy is provided at the substrates to induce chemical reactions with the reactive gases. There is no need to provide an electrical connection to the substrate nor need it be conductive.

If a + argon ion rich bombardment is provided by the embodiments of FIGS. 15 or 16, there will again be provided surface energy to induce chemical reactions. However, the substrate must be electrically conductive in this instance if D.C. power is to be applied thereto. Non-conductive substrates may be employed if RF is applied thereto.

If the reactive gas is present in plasma source 16, the surface energy required at the substrate will be provided by bombarding reactive ions where the ions will chemically combine with the material of the substrate. Argon or the like need not be present in the plasma source although it may. Electrical contact of the substrate is not required nor is substrate conductivity.

If the substrate is bombarded with a plasma rich in + ions of the reactive gas, the same reaction occurs as that described above for bombardment with the neutral or electron rich, reactive gas plasma. In this instance, electrical conductivity of the substrate is needed or else RF must be used. Further, electrical contact to the substrate is also needed.

In either reactive sputter deposition or surface reactions without sputter deposition, there is the possibility of some sputtering of generator cathodes. Thus, it is desirable that these be of the metal involved in the surface reaction. In this way, any accidental sputtering of these surfaces will not contaminate the coating.

The possibility of sputtering of the generator cathodes 22 and 24 has been discussed hereinbefore with respect to FIGS. 5(e) and 5(g). In the FIG. 5(e) embodiment, there may be sputtering of cathode surfaces 22 and 22'. This was at least an order of magnitude less than with a conventional magnetron, but was a predicted effect of the interaction of the two sides. To minimize this type of interaction, the source of FIG. 5(g) may be employed. Now all of the output can be directed toward the substrates. This double V cross-section throws a very side pattern. Correct spacing apart of the two sides permits at a fixed source to substrate distance a quite uniform plasma density.

In some applications, it will still be desirable to have some sputtering of generator cathode surfaces to maintain clean surfaces as material is sputtered off of the substrates.

7. Combination Cleaning and Coating Cathode

Figure 21:
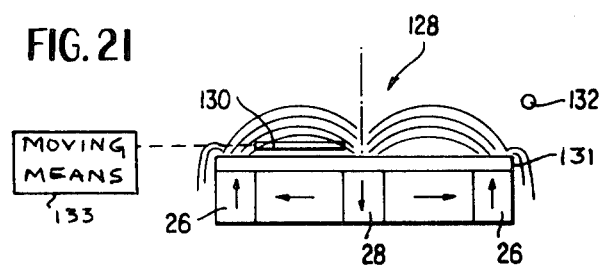
FIG. 21 is a diagrammatic illustration of an illustrative embodiment for cleaning and coating a substrate with a single source.

The 180° cathode-cathode relationship of FIG. 21 is similar to conventional planar magnetron sputter cathodes except for generator anode 130 under the sputter active parts of the line of force loop. This configuration is also shown in FIG. 5(g). Thus, the placement of an appropriately shaped anode such as generator anode 130 close to target 131 of a conventional planar magnetron sputter cathode converts it to a plasma source. It is also desirable that the ground reference of the conventional cathode be changed from the anode to the cathode so that the resulting Ar+ ions have high energy relative to grounded substrates.

Moving means 133 may be provided to alternately move anode 130 over and away from target 131. Thus, unit 128 may either be a plasma source for cleaning substrates, for example, or when anode 130 is moved away from over target 131 it may be a conventional planar magnetron sputter source for coating substrate—all in the same cathode structure. If the usual anode structure 132 for sputtering is correctly located, and is operated during the cleaning cycle, it will separate electrons from the plasma discharge to give an Ar+ bombardment of the substrates.

It should be noted that optimizing unit 128 for both functions tends to generate a conflict. The plasma source needs large cathode areas that do not sputter, and the reverse is true for the sputter source. However, the presence of both functions for essentially the cost of one is desirable in some applications.

8. Clean Up of Waste Materials

In some cases it may be necessary to provide a large anode potential (or floating if the source is + ion rich) surface 91 (FIG. 16) to collect the waste material so that it cannot be re-sputtered. Such a configuration tends to cause the bombardment to be primarily + ions. This presents a possible problem with non-conductive substrates, but provides a unique cleaning technique for grounded conductive substrates.

Figure 23:
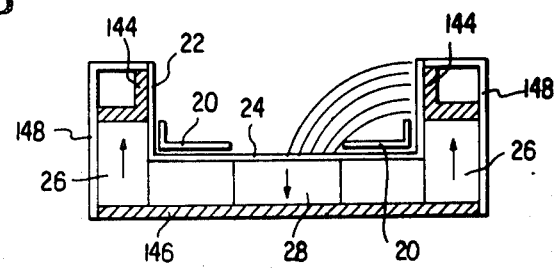
FIG. 23 is a diagrammatic illustration of an illustrative heat source.

This has been demonstrated in a test of the low heat rise device shown in FIG. 23, which device will be described in further detail below. The chamber had been used for a number of hours of coating using aluminum and copper prior to this demonstration. The source was then operated at about 1000 watts for a maximum of 20 minutes. It was then discovered that the grounded walls of the vacuum chamber (not shown) containing the source of FIG. 23 was almost totally cleaned back to shiny clean stainless steel. Corners and edges were the cleanest. The cleaning far exceeded the quality, at least vacuum-wise, that could be achieved by most methods. The windows, plastic parts and other uncovered insulators were deeply coated due to the + ion rich output of the source. In the embodiment of FIG. 16, surface 91 (which may float with respect to ground assuming the output of the source is + ion rich) is employed to collect the waste material cleaned from the substrates. This is the same function as performed by the insulative collecting surfaces of the FIG. 23 embodiment. After the clean-up operation, plate 91 may be removed and cleaned, if necessary, or replaced.

The substrate cleaning technique using the source 10 of the present invention is an important application thereof. Thus, a commerical coating system can be cleaned after an 8–22 hour day's operation by running 1–2 hours with source 10. Hence, many days/year of maintenance time can be eliminated.

The foregoing cleaning of the chamber walls was not expected in that when ions move an appreciable distance through a gas medium there are many collisions of the ion with gas molecules decreasing the ion energy. Low energy bombardment of the walls will heat them—as observed—but should not sputter them. The fact that very marked sputtering occurred leads to the conclusion that very energetic ions were bombarding the surface. Secondly, there appeared to be sputtering from the walls that was much greater in magnitude than can be accounted for on the basis of the direct output current from the ion source.

High energy at the system wall implies a significant voltage gradient near that surface. This was not expected due to the huge area of that surface in comparison with the very small anode in the ion source. Measurements of + ions energy show that energy is lost as one moves away from the source. As each ion strikes neutral argon molecules it will, if still sufficiently energetic, create an additional new + ion and free an electron. The possibility of each initial argon ion generating up to about ten ions and electrons is present. This can provide a large current of + ions at low energy. If these ions then fall through a voltage gradient that creates sputtering at the cathode (system) surface, one can account for what was observed. What happens to the electrons from this secondary generation has not beeen determined. However, it is thought they also somehow get to the chamber wall such that this secondary current of ions and electrons does not get to meters in circuit with the wall. The fact that the quantity of material moved is many times that conventionally sputterable by magnetron forces such a conclusion.

Although there is no intent to be limited to the foregoing theory of operation, the new technology of this invention could increase the sputter rates by a major factor by a very different principle than previously applied. Magnetron sputtering accomplished a decade multiplication of effectiveness over diode sputtering. Now this system appears to provide a similar multiplication of the magnetron in addition to increasing target utilization, etc.

Cascade generation is perhaps a parallel in radiation physics. Here a high energy radiation impinges on matter and dissipates its energy by creating a larger and larger number of lower and lower energy particles. The present invention appears to differ in being able to then re-accelerate this large number of charged particles to do the sputtering. This ionization multiplication effect becomes a major consideration with the plasma/ion source. With this it may be possible to provide many times the cleaning, coating, reacting, sensitizing, etc. that are possible by most other methods.

9. High Value or Dangerous Target Material Retrieval

The collection of clean-up material as discussed above has two more very significant applications. The retrieval of gold and other expensive target materials can be achieved via the ion cleaning technique discussed. This does not separate the individual materials from each other, but permits one to concentrate to small retrieval surface 91 the previously scattered materials. The retrieval of dangerous materials can be done this same way. Note in this application, surface 91 is small and thus the collection of the expensive or dangerous material will take longer than the collection of waste material as described above. However, it will be more concentrated. This method of system cleaning is unique in its manner of self cleaning and retrieving the collected material. This one aspect moves the percent retention of critical materials to a very good figure. As we enter an era of great concern over pollution, especially with radioactive materials, poisonous metals, etc., the introduction of a faster deposition method with full built-in cleanup is very advantageous.

10. Heating a. Substrate Heating

Heating of substrates 112 and 114 of FIGS. 16 and 17 by plasma bombardment provides cleaning and heating thereof simultaneously. Electron bombardment may be effected by applying negative high voltage to cathode 23 and collector electrod 30 to remove + ions. The electron energy can provide non-sputtering fast heat transfer to conductive substrates 112 and 114. Tungsten filaments can provide higher electron yields, but with resultant tungsten contamination.

b. In general

As discussed hereinbefore with respect to FIGS. 7(b) and 7(c), the plasma source of this invention may comprise a heat source in which little heat is lost in the source. The structure shown in FIG. 23 has demonstrated unique properties of very cool operation of both anode 20 and cathode 23. Yet its plasma and + ion output quickly heated the metal vacuum chamber (not shown) containing it and cleaned the chamber's inside surfaces, as discussed above. Crude calculation of the energy retained in the structure suggest that better than 80% efficiency was obtained. A small collector (not shown) a few inches from the front of the source established a voltage of +100 volts and when maintained at ground potential entertained 0.2 amperes when the total source current was 2 amperes at 500 volts. Thus, there was a net + ion flow from this source even without an external anode, the net + ion flow occurring because of the facing relation of the generator cathodes. Application of a negative bias on a collector electrode (not shown) increased the current there to 1.5 amps at about 400 volts. Magnet 26 was in contact with L-shaped pole piece 144 while magnets 26 and 28 were coupled with pole plate 146. Insulator 148 was disposed about the magnetic structure.

11. Pumping

Figure 22:
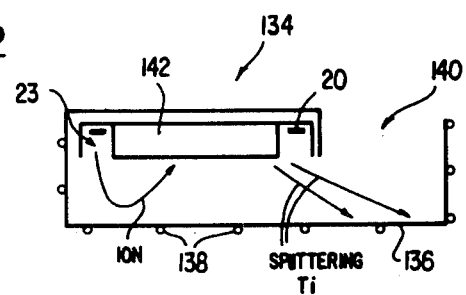
FIG. 22 is a diagrammatic illustration of an embodiment for pumping active gases.

Some processes may employ the pump 134 of FIG. 22 for the selective pumping of reactive gases, such as $O_2$, $N_2$, $H_2O$, $CO_2$, etc. The use of a sputter cathode 142 aimed at a shield 136 cooled via pipes 138 provides very fast pumping of these materials if the target is titanium, for example. In the roll coating industry, the foregoing arrangement makes possible a narrow, very long pump that can extend across a web to pump the outgassing products, unreacted process gases, etc.

12. Sensitization

Also in the roll coating industry there is a need to provide activation or sensitization of the materials prior to their being coated or bonded by any of the available methods. This activation or sensitization can also be achieved by the sources of FIGS. 16 and 17 with their unique capacity for being adjusted over a range of outputs from electrons through neutral plasma to positive ions.

13. Charge Elimination

The source of FIGS. 16 and 17 is also useful in roll coating to discharge built-up charges on the film. Typically these can discharge to the roller mechanism at the edges of the film, destroying the film there. Because a sputter cathode typically discharges electrons to the substrate, a + ion rich source of rather low energy can be used to bring neutrality to the roll.

In the foregoing embodiments, permanent magnets for use as magnets 26 and 28, for example, preferably may constitute stacks or coils of magnet strips such as the ferrite impregnated plastic or rubber tapes sold by Minnesota Mining and Manufacturing Co. under the PL-1.4 H designation. Such stacks or coils are illustrated, for example, in U.S. Pat. Nos. 4,162,954 and 4,180,450, which are assigned to the present assignee and which are incorporated herein by reference.

It is to be understood that the above detailed description of the various embodiments of the invention is provided by way of example only. Various details of design and construction may be modified without departing from the true spirit and scope of the invention as set forth in the appended claims.

In the descriptive explanations and claims of this patent application we have used multiple cathode surfaces. It should be noted that if we replace all but one of these surfaces with an insulator or an electrically insulated conductive element, those surfaces can charge to near the potential of the real cathode. Electrons are free to move along the magnetic lines of force that connect those surfaces, thus any significant difference in potential results in electron flow that reduces that difference. For purposes of this patent application and the claims following we will not distinguish between real cathodes and such "pseudo" cathodes, for both perform the electric field forming cathode function.

The second cathode related function is that of providing the electrons needed for the ion/plasma generation. In the descriptions thus far, we have implied electron emission by the general cathode surfaces. It is not intended, however, that we are so restricted. Filaments, hollow cathodes and beta sources, for example, may also serve this portion of the cathode function. In addition, electron emission enhancement by oxide coatings, UV radiation, etc. becomes a meaningful portion of the technology.

What is claimed is:

1. Sputtering apparatus comprising
   at least one element to be sputtered;
   at least one plasma source for generating a plasma from at least one ionizable gas where at least some of the charged particles of the plasma sputter the element, said plasma source including
   a generator having at least two separate surfaces;
   means for generating a magnetic field having lines of force which pass through both of the two cathode surfaces;
   a generator anode disposed adjacent that portion of the magnetic field between the two cathode surfaces;
   means for establishing an electric field between the generator anode and the generator cathode where at least portions of the electric and magnetic fields are substantially perpendicular to one another
   whereby said plasma is formed between the cathode surfaces and ejected away from the generator cathode.

2. Apparatus as in claim 1 where the magnetic lines of force are substantially perpendicular to the cathode surfaces where they pass through these surfaces.

3. Apparatus as in claims 1 or 2 including a further said plasma source where said one and further plasma sources cross feed a part of their respective ejected plasma to one another.

4. Apparatus as in claims 1 or 2 where said plasma source has an endless loop configuration so that the configuration of the plasma formed between the cathode surfaces is also an endless loop.

5. Apparatus as in claim 1 or 2 where the two cathode surfaces are in electrical contact with one another and where said generator anode is disposed between the generator cathode surfaces and said magnetic lines of force.

6. Apparatus as in claim 1 where the angle between the cathode surfaces ranges from $-360°$ through $0°$ to $+360°$.

7. Apparatus as in claim 6 where said angle is $0°$.
8. Apparatus as in claim 6 where said angle is $90°$.
9. Apparatus as in claim 6 where said angle is $135°$.
10. Apparatus as in claim 6 where said angle is $180°$.
11. Apparatus as in claim 6 where said angle is $270°$.
12. Apparatus as in claim 6 where said angle is $360°$.
13. Apparatus as in claim 6 where said angle is $-90°$.
14. Apparatus as in claim 6 where said angle is $-180°$.
15. Apparatus as in claim 1 including means for introducing the ionizable gas into the apparatus at a point removed from the plasma source.
16. Apparatus as in claim 1 including means for introducing the ionizable gas directly into the plasma source.
17. Apparatus as in claim 16 where a second gas is present in the apparatus at a point removed from the gas introduced into the plasma source.
18. Apparatus as in claim 1 where said ionizable gas includes an active gas.
19. Apparatus as in claim 1 where said ionizable gas includes an inert gas.
20. Apparatus as in claim 2 where said means for generating the magnetic field includes means for preventing the formation of closed magnetic loops over the generator cathode surfaces.
21. Apparatus as in claim 1 where said means for generating the magnetic field includes means for generating a further magnetic field having lines of force which pass through both of the cathode surfaces.
22. Apparatus as in claim 1 where said means for generating the magnetic field includes at least one permanent magnet.
23. Apparatus as in claim 1 or 22 where said means for generating the magnetic field includes at least one electromagnet.
24. Apparatus as in claims 1 or 2 where said element is magnetically permeable.
25. Apparatus as in claim 2 where the relative locations of the generator anode and generator cathode are such with respect to the magnetic field that the generator anode intercepts substantially no magnetic lines of force from the generator cathode more than about $\frac{1}{8}''$ from the generator cathode.
26. Apparatus as in claim 25 where the generator anode intercepts substantially no lines of force more than about $1/16''$ from the generator cathode.
27. Apparatus as in claim 25 where the generator anode intercepts substantially no lines of force more than about $\frac{1}{4}''$ from the generator cathode.
28. Apparatus as in claim 25 or 26 where said one element is heated by at least some of the charged particles ejected from the plasma source such that little heat is lost (a) in said generator cathode due to the perpendicular orientation of the magnetic lines of force with respect to the cathode and (b) in said generator anode due to the short length of the magnetic lines of force from the generator cathode to the generator anode.
29. Apparatus as in claims 1 or 2 including a collector electrode and means for biasing the collector electrode to remove predetermined charged particles from the ejected plasma.
30. Apparatus as in claim 29 including means for applying an alternating current electrical potential to the collector electrode.
31. Apparatus as in claim 30 where said element is electrically non-conductive.
32. Apparatus as in claim 31 where said element includes a target of coating material and where said apparatus includes a further element including a substrate upon which the coating material of the target is to be deposited.
33. Apparatus as in claim 29 including means for biasing the collector electrode to remove electrons from the ejected plasma so that said element is sputtered by positive ions.

34. Apparatus as in claim 33 where said element is electrically conductive and grounded.

35. Apparatus as in claim 29 including means for biasing the collector electrode to remove some of the positive ions from the ejected plasma.

36. Apparatus as in claim 35 where said one element is electrically non-conductive and is sputtered by the ions remaining in the ejected plasma.

37. Apparatus as in claim 29 including a web and means for moving the web where the charged particles from the plasma source are applied to the moving web.

38. Apparatus as in claims 1 or 2 where said ionizable gas is an active gas and where the active gas ions of the ejected plasma sputter said one element.

39. Apparatus as in claim 38 where said one element includes a target of coating material and where said apparatus includes a further element including a substrate upon which the coating material of the target is to be deposited.

40. Apparatus as in claim 38 where said target is electrically conductive and grounded.

41. Apparatus as in claims 1 or 2 where said ionizable gas contains an active gas and where ions of the ejected plasma sputter said one element.

42. Apparatus as in claim 41 where said one element includes a target of coating material and where said apparatus includes a further element including a substrate upon which the coating material of the target is to be deposited.

43. Apparatus as in claim 41 where said target is electrically conductive and grounded.

44. Apparatus as in claim 1 where said element is electrically non-conductive and said apparatus includes means for applying an alternating current electrical potential to the element.

45. Apparatus as in claims 1 or 2 including a further said plasma source where said one and further plasma sources each include (a) a collector electrode and (b) means for biasing the collector electrodes with opposite polarity voltages so that said element is simultaneously bombarded with positively charged ions from the one plasma source and electrons from the further plasma source.

46. Apparatus as in claim 45 where said one element includes a target of coating material and said apparatus includes a further element including a substrate upon which the coating material of the target is deposited.

47. Apparatus as in claim 46 where the target is electrically non-conductive.

48. Apparatus as in claims 1 or 2 where the element is sputtered by the plasma ejected from the plasma source.

49. Apparatus as in claim 48 where the element is electrically conductive and grounded.

50. Apparatus as in claim 48 where the element is electrically non-conductive.

51. Apparatus as in claim 1 where said one element is a substrate to be coated with a coating material and where the sputtering of the substrate effects cleaning thereof.

52. Apparatus as in claim 51 where the substrate is electrically non-conductive and where it is cleaned by the plasma ejected from the plasma source.

53. Apparatus as in claim 51 where said plasma source includes a collector electrode and means for biasing the collector electrode to remove electrons from the ejected plasma so that said substrate is cleaned by positively charged ions.

54. Apparatus as in claims 1 or 2 where said one element includes a substrate to be coated with a coating material and said apparatus includes means for generating and depositing the coating material on the substrate.

55. Apparatus as in claim 54 where the ejected plasma from the plasma source sputters loosely bonded atoms of the material coated onto the substrate.

56. Apparatus as in claim 54 where the generator cathode comprises the same material as that being coated on the substrate.

57. Apparatus as in claim 54 where said plasma source includes a collector electrode and means for biasing the collector electrode to remove electrons from the ejected plasma so that positively charged ions of the gas sputter loosely coated atoms of the coating material deposited on the substrate.

58. Apparatus as in claim 57 where the gas includes an inactive gas.

59. Apparatus as in claim 57 where the gas includes an active gas.

60. Apparatus as in claim 54 including a coating material collecting electrode and where said substrate is electrically conductive, grounded and coated with material to be collected on the collecting electrode where the apparatus includes means for applying a positive electrical potential to the collecting electrode whereby positive ions in the ejected plasma sputter the material coated on the substrate for collection on the collecting electrode and where the positive electrical potential on the collecting electrode prevents sputtering of the coating material collected thereon whereby the substrate is cleaned.

61. Apparatus as in claim 60 including means for retrieving the coating material collected on the collecting electrode.

62. Apparatus as in claim 60 where said coating material is gold.

63. Apparatus as in claim 60 where said coating material is dangerous to human beings.

64. Apparatus as in claim 1 where said one element is a substrate and where said apparatus includes means for contacting said substrate with a reactive gas intended for reaction with the substrate and where said plasma source includes a collector electrode and means for biasing the collector electrode to remove electrons from the ejected plasma so that said substrate has its surface energy increased by positively charged ions to thereby facilitate reaction of the substrate with the reactive gas.

65. Apparatus as in claim 1 where said one element is a substrate and where said gas is to be chemically reacted with the substrate and where the plasma source includes a collector electrode and means for biasing the collector electrode to remove electrons from the ejected plasma so that positively charged ions of the gas bombard the substrate to facilitate chemical reaction therebetween.

66. Apparatus as in claim 1 where said one element comprises an electrically conductive substrate and said apparatus includes an electrically non-conductive element in contact with the substrate, means for generating and depositing an electrically conductive coating material on the substrate and where said plasma source includes a collector electrode and means for biasing the collector electrode to remove positively charged ions from the ejected plasma and where said apparatus includes means for positively biasing the substrate to prevent the sputtering of coating material from the substrate by any positively charged ions that are not removed by the collector electrode whereby the substrate will be coated but the electrically non-conductive element will not be coated due to the sputtering of any coating material deposited thereon by said positively charged ions which are not removed by the collector electrode.

67. Apparatus as in claim 66 where said means for generating the coating material includes means for sputtering the coating material.

68. Apparatus as in claim 67 where the sputtering means includes a cathode of the coating material which is sputtered by positively charged ions obtained from the plasma formed between the two generator cathode surfaces but which are not ejected from the plasma from the plasma source.

69. Apparatus as in claim 68 where said target is located adjacent the generator anode.

70. Apparatus as in claims 1 or 10 including means for moving said generator anode into and out of ion ejecting relationship with the plasma formed between the generator cathode surfaces, a further anode, means for establishing a further electric field between the further anode and the generator cathode where at least portions of the further electric field and the magnetic field are substantially perpendicular with respect to one another so that the generator cathode is sputtered and means for alternatively establishing (a) the electric field associated with the generator anode when it is in said ion ejecting relationship and (b) the further electric field when the generator anode is not in said ion ejecting relationship.

71. Apparatus as in claims 1 or 2 where said one element comprises a target of coating material and where the apparatus includes a further element including a substrate upon which the coating material of the target is to be deposited and means for cooling said substrate and where at least some of the charged particles of the ejected plasma sputter the target whereby gases coming into contact with the coated substrate are pumped.

72. A plasma source for generating a plasma from at least one ionizable gas, said source comprising
   a generator cathode having at least two separate surfaces;
   means for generating a magnetic field having lines of force which pass through both the two cathode surfaces;
   a generator anode disposed adjacent that portion of the magnetic field between the two cathode surfaces,
   means for establishing an electric field between the generator anode and the generator cathode where at least portions of the electric and magnetic fields are substantially perpendicular to one another whereby said plasma is formed between the cathode surfaces and ejected away from the generator cathode.

73. A source as in claim 72 where the magnetic lines of force are substantially perpendicular to the cathode surfaces where they pass through these surfaces.

74. A source as in claims 72 or 73 where said plasma source includes a collector electrode and means for biasing the collector electrode to remove predetermined charged particles from the ejected plasma.

75. A source as in claim 74 where said charged particles are electrons.

76. A source as in claim 74 where said charged particles are positive ions.

77. A source as in claim 74 including means for applying an alternating current electrical potential to the collector electrode.

78. A source as in claims 72 or 73 including a further said plasma source where said one and further plasma sources cross feed a part of their respective ejected plasmas to one another.

79. A source as in claims 72 or 73 having an endless loop configuration so that the configuration of the plasma formed between the cathode surfaces is also an endless loop.

80. A source as in claim 73 where the two cathode surfaces are in electrical contact with one another and where said generator anode is disposed between the cathode surfaces and said magnetic lines of force.

81. A source as in claims 72 or 80 where the angle between the cathode surfaces ranges from −360° through 0° to +360°.

82. A source as in claim 81 where said angle is 0°.
83. A source as in claim 81 where said angle is 90°.
84. A source as in claim 81 where said angle is 135°.
85. A source as in claim 81 where said angle is 180°.
86. A source as in claim 81 where said angle is 270°.
87. A source as in claim 81 where said angle is 360°.
88. A source as in claim 81 where said angle is −90°.
89. A source as in claim 81 where said angle is −180°.

90. A source as in claims 72 or 73 where the relative locations of the generator anode and generator cathode are such with respect to the magnetic field that the generator anode intercepts substantially no lines of force from the generator cathode more than about ⅛" from the generator cathode.

91. A source as in claim 90 where the generator anode intercepts substantially no lines of force more than about ¼" from the generator cathode.

92. A source as in claim 90 where the generator anode intercepts substantially no lines of force more than about 1/16" from the generator cathode.

93. A source as in claim 72 including means for introducing the ionizable gas directly into the plasma source.

94. A source as in claims 72 or 73 where said ionizable gas includes an active gas.

95. A source as in claims 72 or 73 where said ionizable gas includes an inert gas.

96. A source as in claim 73 where said means for generating the magnetic field includes means for preventing the formation of closed magnetic loops over the generator cathode surfaces.

97. A source as in claim 72 where where said means for generating the magnetic field includes means for generating a further magnetic field having lines of force which pass through both of the cathode surfaces.

98. A source as in claim 72 where said means for generating the magnetic field includes at least one permanent magnet.

99. A source as in claim 72 or 98 where said means for generating the magnetic field includes at least one electromagnet.

100. A sputtering method comprising the steps of
   providing at least one element to be sputtered;
   providing a plasma source for generating a plasma from at least one ionizable gas where at least some of the charged particles of the plasma sputter the element and where the plasma generating step includes the steps of providing a generator cathode having at least two separate surfaces;

generating a magnetic field having lines of force which pass through both of the two cathode surfaces;

providing a generator anode disposed adjacent that portion of the magnetic field between the two cathode surfaces;

establishing an electric field between the generator anode and the generator cathode where at least portions of the electric and magnetic fields are substantially perpendicular to one another whereby said plasma is formed between the cathode surfaces and ejected away from the generator cathode.

101. A method as in claim 100 where the magnetic lines of force are substantially perpendicular to the cathode surfaces where they pass through these surfaces.

102. A method as in claim 101 including locating the generator anode and generator cathode with respect to the magnetic field so that the generator anode intercepts substantially no lines of force from the generator cathode more than about ⅛" from the generator cathode.

103. A method as in claim 102 where the generator anode intercepts substantially no lines of force more than about ¼" from the generator cathode.

104. A method as in claim 102 where the generator anode intercepts substantially no lines of force more than about 1/16" from the generator cathode.

105. A method as in claim 102 or 104 where said one element is heated by at least some of the charged particles ejected from the plasma source such that little heat is lost (a) in said generator cathode due to the perpendicular orientation of the magnetic lines of force with respect to the cathode and (b) in said generator anode due to the short length of the magnetic lines of force from the generator cathode to the generator anode.

106. A method as in claims 100 or 101 where said element is magnetically permeable.

107. A method as in claims 100 or 101 including providing a collector electrode and biasing the collector electrode to remove predetermined charged particles from the ejected plasma.

108. A method as in claim 107 including applying an alternating current electrical potential to the collector electrode.

109. A method as in claim 108 where said element is electrically non-conductive.

110. A method as in claim 109 where said element includes a target of coating material and where said method includes providing a further element including a substrate upon which the coating material of the target is to be deposited.

111. A method as in claim 107 including biasing the collector electrode to remove electrons from the ejected plasma so that said element is sputtered by positive ions.

112. A method as in claim 111 where said element is electrically conductive and grounded.

113. A method as in claim 107 including biasing the collector electrode to remove some of the positive ions from the ejected plasma.

114. A method as in claim 113 where said one element is electrically non-conductive and is sputtered by the ions remaining in the ejected plasma.

115. A method as in claim 107 including moving a web of material where the charged particles from the plasma source are applied to the moving web.

116. A method as in claims 100 or 101 where said ionizable gas in an active gas and where the active gas ions of the ejected plasma sputter said one element.

117. A method as in claims 100 or 101 where said one element includes a target of coating material and where said method includes providing a further element including a substrate upon which the coating material of the target is to be deposited.

118. A method as in claim 116 where said target is electrically conductive and grounded.

119. A method as in claim 100 where said element is electrically non-conductive and said method includes applying an alternating current electrical potential to the element.

120. A method as in claims 100 or 101 including providing a further said plasma source where said one and further plasma sources each include a collector electrode and said method includes biasing the collector electrodes with opposite polarity voltages so that said element is simultaneously bombarded with positively charged ions from the one plasma source and electrons from the further plasma source.

121. A method as in claim 120 where said one element includes a target of coating material and said method includes providing a further element including a substrate upon which the coating material of the target is deposited.

122. A method as in claim 121 where the target is electrically non-conductive.

123. A method as in claims 100 or 101 where the element is sputtered by the plasma ejected from the plasma source.

124. A method as in claim 123 where the element is electrically conductive and grounded.

125. A method as in claim 123 where the element is electrically non-conductive.

126. A method as in claim 100 where said one element is a substrate to be coated with a coating material and where the sputtering of the substrate effects cleaning thereof.

127. A method as in claim 126 where the substrate is electrically non-conductive and where it is cleaned by the plasma ejected from the plasma source.

128. A method as in claim 126 where said plasma source includes a collector electrode and where said method includes biasing the collector electrode to remove electrons from the ejected plasma so that said substrate is cleaned by positively charged ions.

129. A method as in claims 100 or 101 where said one element includes a substrate to be coated with a coating material and said method includes generating and depositing the coating material on the substrate.

130. A method as in claim 129 where said plasma source includes a collector electrode and said method includes biasing the collector electrode to remove electrons from the ejected plasma so that positively charged ions of the gas supply additional energy to the substrate.

131. A method as in claim 129 where the ejected plasma from the plasma source sputters loosely bonded atoms of the material coated onto the substrate.

132. A method as in claim 129 where the generator cathode comprises the same material as that being coated on the substrate.

133. A method as in claim 129 where said plasma source includes a collector electrode and said method includes biasing the collector electrode to remove electrons from the ejected plasma so that positively charged ions of the gas sputter loosely coated atoms of the coating material deposited on the substrate.

134. A method as in claim 133 where the gas includes an inactive gas.

135. A method as in claim 133 where the gas includes an active gas.

136. A method as in claim 129 including providing a coating material collecting electrode and where said substrate is electrically conductive, grounded and coated with material to be collected on the collecting electrode and where the method includes applying a positive electrical potential to the collecting electrode whereby positive ions in the ejected plsma sputter the material coated on the substrate for collection on the collecting electrode and where the positive electrical potential on the collecting electrodes prevents sputtering of the coating material collected thereon whereby the substrate is cleaned.

137. A method as in claim 136 including retrieving the coating material collected on the collecting electrode.

138. A method as in claim 137 where said coating material is gold.

139. A method as in claim 137 where said coating material is dangerous to human beings.

140. A method as in claims 100 and 101 where said one element is a substrate and where said method includes contacting said substrate with a reactive gas intended for reaction with the substrate and where said plasma source includes a collector electrode and the method includes biasing the collector electrode to remove electrons from the ejected plasma so that said substrate has its surface energy increased by positively charged ions to thereby facilitate reaction of the substrate with the reactive gas.

141. A method as in claim 100 or 101 where said one element is a substrate and where said gas is to be chemically reacted with the substrate and where the plasma source includes a collector electrode and the method includes biasing the collector electrode to remove electrons from the ejected plasma so that positively charged ions of the gas bombard the substrate to facilitate chemical reaction therebetween.

142. A method as in claims 100 or 101 where said one element comprises an electrically conductive substrate and said method includes providing an electrically non-conductive element in contact with the substrate, generating and depositing an electrically conductive coating material on the substrate and where said plasma source includes a collector electrode and said method includes biasing the collector electrode to remove positively charged ions from the ejected plasma and positively biasing the substrate to prevent the sputtering of coating material from the substrate by any positively charged ions that are not removed by the collector electrode whereby the substrate will be coated but the electrically non-conductive element will not be coated due to the sputtering of any coating material deposited thereon by said positively charged ions which are not removed by the collector electrode.

143. A method as in claim 142 where said generating the coating material includes sputtering thereof.

144. A method as in claim 143 including providing a cathode of the coating material which is sputtered by positively charged ions obtained from the plasma formed between the two generator cathode surfaces but which are not ejected with the plasma from the plasma source.

145. A method as in claim 144 where said target is located adjacent the generator anode.

146. A method as in claim 100 including moving said generator anode into and out of ion ejecting relationship with the plasma formed between the generator cathode surfaces, providing a further anode, establishing a further electrical field between the further anode and the generator cathode where at least portions of the further electric field and the magnetic field are substantially perpendicular with respect to one another so that the generator cathode is sputtered and alternatively establishing (a) the electric field associated with generator anode when it is in said ion ejecting relationship and (b) the further electric field when the generator anode is not in said ion ejecting relationship.

147. A method as in claim 146 where said one element is a substrate which is cleaned when the generator anode is in said ion ejecting relationship and where said substrate is coated with the material comprising the generator cathode when the generator anode is not in said ion ejecting relationship.

148. A method as in claims 100 or 101 where said one element comprises a target of coating material and where the method includes providing a further element including a substrate upon which the coating material of the target is to be deposited and cooling said substrate and where at least some of the charged particles of the ejected plasma sputter the target whereby gases coming into contact with the coated substrate are pumped.

149. A method comprising the steps of
providing at least one element;
generating a plasma from at least one ionizable gas where at least some of the charged particles of the plasma bombard the element and where the plasma generating step includes the steps of
providing a generator cathode having at least two separate surfaces;
generating a magnetic field having lines of force which pass through both of the two cathode surfaces;
providing a generator anode disposed adjacent that portion of the magnetic field between the two cathode surfaces;
establishing an electric field between the generator anode and the generator cathode where at least portions of the electric and magnetic fields are substantially perpendicular to one another
whereby said plasma is formed between the cathode surfaces and ejected away from the generator cathode.

150. A method as in claim 149 where the magnetic lines of force are substantially perpendicular to the cathode surfaces where they pass through these surfaces.

151. A method as in claim 150 where said one element is heated by at least some of the charged particles ejected from the plasma source such that little heat is lost in said generator cathode due to the perpendicular orientation of the magnetic lines of force with respect to the cathode.

152. A method as in claim 150 including locating the generator anode and generator cathode with respect to the magnetic field so that the generator anode intercepts substantially no lines of force from the generator cathode more than about ⅛" from the generator cathode.

153. A method as in claim 152 where the generator anode intercepts substantially no lines of force more than about ¼" from the generator cathode.

154. A method as in claim 152 where the generator anode intercepts substantially no lines of force more than about 1/16" from the generator cathode.

155. A method as in claim 152 or 154 where said one element is heated by at least some of the charged particles ejected from the plasma source such that little heat is lost (a) in said generator cathode due to the perpendicular orientation of the magnetic lines of force with respect to the cathode and (b) in said generator anode due to the short length of the magnetic lines of force from the generator cathode to the generator anode.

156. A method as in claims 149 or 150 where said one element is a web of material and the method includes moving the web where the charged particles from the plasma source are applied to the moving web to sensitize it.

157. A method as in claims 149 or 150 where said one element is a web of material and the method includes moving the web where the charged particles from the plasma source are applied to the moving web to neutralize further charge on the web.

158. A method for selectively coating a first substrate in the presence of a second substrate where the first substrate is electrically conductive and the second substrate is electrically non-conductive comprising the steps of
generating and directing an electrically conductive coating material toward the first and second substrates, directing a plasma toward the first and second substrates where the plasma contains more electrons than positive ions, and
biasing the first substrate to prevent the sputtering of coating material therefrom by positive ions in the plasma so that the first substrate will be coated but the second substrate will not be coated duue to the sputtering of any coating material deposited thereon by said positive ions.

159. A method as in claim 158 where said first and second substrates are in contact with each other.

160. A method for selectively coating a first substrate in the presence of a second substrate where the first substrate is electrically non-conductive and the second substrate is electrically conductive comprising the steps of
generating and directing an electrically conductive coating material toward the first and second substrates, directing a plasma toward the first and second substrates where the plasma contains less electrons than positive ions, and
biasing the second substrate to prevent the coating thereof due to the sputtering of any coating material deposited thereon by said positive ions, said first substrate being coated due to the build-up of said positive ions thereon which prevent sputtering of the deposited coating by further ions in the plasma.

161. A method for selectively coating an electrically conductive substrate in contact with an electrically non-conductive element comprising the steps of
generating and directing an electrically conductive coating material toward the substrate and non-conductive element, directing a plasma toward the substrate and non-conductive element where the plasma contains more electrons than positive ions, and
biasing te substrate to prevent the sputtering of coating material from the substrate by positive ions in the plasma so that the substrate will be coated but the electrically non-conductive element will not be coated due to the sputtering of any coating material deposited thereon by said positive ions.

162. A method for cleaning from a substrate material coated thereon comprising the steps of
providing an electrically conductive collection electrode;
directing toward the substrate and the collection electrode a plasma where the number of electrons contained therein is substantially different than the number of positive ions where the coating material on the substrate will be sputtered and removed by the positive ions; and
biasing the collection electrode to prevent sputtering of the coating material removed from the substrate and collected thereon to thereby clean the substrate.

163. A method as in claim 162 where said substrate is electrically conductive and biased to attract the positive ions thereto so that the positive ions can sputter the coated material therefrom.

164. A method as in claim 163 where the number of positive ions in the plasma is greater than that of the electrons.

165. A method as in claim 163 where said coated material is gold and is retrieved from the collection electrode.

166. A method as in claim 162 where said substrate is electrically non-conductive and the number of electrons in the plasma is greater than that of the positive ions so that the electrons can neutralize positive ions which tend to build up on the substrate so that remaining ions in the plasma can sputter the coating on the substrate.

167. A method as in claims 162 or 166 where said coated material is dangerous to human beings and is retrieved from the collection electrode.

* * * * *